US 8,208,119 B2

(12) United States Patent
Kobayashi et al.

(10) Patent No.: US 8,208,119 B2
(45) Date of Patent: Jun. 26, 2012

(54) EXPOSURE APPARATUS, EXPOSURE METHOD, AND METHOD FOR PRODUCING DEVICE

(75) Inventors: Naoyuki Kobayashi, Fukaya (JP); Soichi Owa, Kumagaya (JP); Shigeru Hirukawa, Tokyo (JP); Yasuhiro Omura, Kounosu (JP)

(73) Assignee: Nikon Corporation, Tokyo (JP)

( * ) Notice: Subject to any disclaimer, the term of this patent is extended or adjusted under 35 U.S.C. 154(b) by 721 days.

(21) Appl. No.: 10/588,297

(22) PCT Filed: Feb. 3, 2005

(86) PCT No.: PCT/JP2005/001990
§ 371 (c)(1),
(2), (4) Date: Nov. 2, 2006

(87) PCT Pub. No.: WO2005/076324
PCT Pub. Date: Aug. 18, 2005

(65) Prior Publication Data
US 2008/0106707 A1    May 8, 2008

(30) Foreign Application Priority Data
Feb. 4, 2004 (JP) ................. 2004-028092

(51) Int. Cl.
*G03B 27/42* (2006.01)
(52) U.S. Cl. .......................... 355/53; 355/30
(58) Field of Classification Search .......... 355/30, 355/53
See application file for complete search history.

(56) References Cited

U.S. PATENT DOCUMENTS

| 4,346,164 A | 8/1982 | Tabarelli et al. |
| 4,465,368 A | 8/1984 | Matsuura et al. |
| 4,480,910 A | 11/1984 | Takanashi et al. |
| 4,509,852 A * | 4/1985 | Tabarelli et al. ............... 355/30 |
| 4,780,617 A | 10/1988 | Umatate et al. |
| 4,780,747 A | 10/1988 | Suzuki et al. |
| RE32,795 E | 12/1988 | Matsuura et al. |
| 5,063,582 A * | 11/1991 | Mori et al. .................... 378/34 |
| 5,493,403 A | 2/1996 | Nishi |
| 5,528,118 A | 6/1996 | Lee |

(Continued)

FOREIGN PATENT DOCUMENTS

DE        221 563 A1    4/1985

(Continued)

OTHER PUBLICATIONS

International Search Report mailed Jul. 18, 2006 for U.S. National Phase Application No. PCT/JP2006/308040.

(Continued)

*Primary Examiner* — Edward Glick
*Assistant Examiner* — Mesfin T Asfaw
(74) *Attorney, Agent, or Firm* — Oliff & Berridge, PLC

(57) ABSTRACT

An exposure apparatus (EX) exposes a substrate (P) by irradiating exposure light (EL) on the substrate (P) through liquid (LQ). The exposure apparatus (EX) has a substrate holder (PH) for holding the substrate (P), a substrate stage (PST) capable of moving the substrate (P) held by the substrate holder (PH), and a temperature adjusting system (60) for adjusting the temperature of the substrate holder (PH). The temperature of the substrate (P) is controlled so that there is no difference in temperature between the substrate (P) and the liquid (LQ), thereby preventing a reduction in exposure accuracy resulting from variation in temperature of the liquid (LQ).

40 Claims, 13 Drawing Sheets

U.S. PATENT DOCUMENTS

| | | | |
|---|---|---|---|
| 5,610,683 | A | 3/1997 | Takahashi |
| 5,623,853 | A | 4/1997 | Novak et al. |
| 5,715,039 | A | 2/1998 | Fukuda et al. |
| 5,738,165 | A | 4/1998 | Imai |
| 5,825,043 | A | 10/1998 | Suwa |
| 5,864,386 | A * | 1/1999 | Nei ............................ 355/30 |
| 5,874,820 | A | 2/1999 | Lee |
| 5,969,441 | A | 10/1999 | Loopstra et al. |
| RE36,730 | E | 6/2000 | Nishi |
| 6,208,407 | B1 | 3/2001 | Loopstra |
| 6,228,544 | B1 | 5/2001 | Ota |
| 6,341,007 | B1 | 1/2002 | Nishi et al. |
| 6,590,634 | B1 | 7/2003 | Nishi et al. |
| 6,611,316 | B2 | 8/2003 | Sewell |
| 6,650,399 | B2 | 11/2003 | Baselmans et al. |
| 6,674,510 | B1 | 1/2004 | Jasper et al. |
| 6,721,034 | B1 | 4/2004 | Horikawa |
| 6,721,039 | B2 | 4/2004 | Ozawa |
| 6,778,257 | B2 | 8/2004 | Bleeker et al. |
| 6,819,414 | B1 | 11/2004 | Takeuchi |
| 6,897,963 | B1 | 5/2005 | Taniguchi et al. |
| 2002/0041377 | A1 | 4/2002 | Hagiwara et al. |
| 2002/0061469 | A1 | 5/2002 | Tanaka |
| 2002/0063856 | A1 | 5/2002 | Inoue |
| 2004/0136494 | A1* | 7/2004 | Lof et al. .................. 378/34 |
| 2004/0165159 | A1 | 8/2004 | Lof et al. |
| 2004/0189964 | A1* | 9/2004 | Nijmeijer et al. ............ 355/55 |
| 2004/0207824 | A1 | 10/2004 | Lof et al. |
| 2005/0046813 | A1 | 3/2005 | Streefkerk et al. |
| 2005/0146694 | A1 | 7/2005 | Tokita |
| 2005/0146695 | A1 | 7/2005 | Kawakami |
| 2005/0264780 | A1 | 12/2005 | Graeupner |
| 2006/0007415 | A1 | 1/2006 | Kosugi et al. |
| 2006/0033892 | A1 | 2/2006 | Cadee et al. |
| 2006/0038968 | A1 | 2/2006 | Kemper et al. |
| 2006/0061747 | A1 | 3/2006 | Ishii |
| 2006/0152698 | A1 | 7/2006 | Ishii |
| 2006/0187432 | A1 | 8/2006 | Yasuda et al. |
| 2007/0132976 | A1 | 6/2007 | Nagasaka |
| 2007/0291239 | A1 | 12/2007 | Shiraishi |
| 2008/0018867 | A1 | 1/2008 | Fujiwara et al. |
| 2008/0106707 | A1 | 5/2008 | Kobayashi et al. |

FOREIGN PATENT DOCUMENTS

| | | |
|---|---|---|
| DE | 224 448 A1 | 7/1985 |
| EP | 0 834 773 A2 | 4/1998 |
| EP | 1 041 357 A1 | 10/2000 |
| EP | 1 420 298 A2 | 5/2004 |
| EP | 1 498 781 A2 | 1/2005 |
| EP | 1 624 481 A1 | 2/2006 |
| EP | 1 672 680 A1 | 6/2006 |
| EP | 1 677 341 A1 | 7/2006 |
| EP | 1 843 384 A1 | 10/2007 |
| JP | A 57-117238 | 7/1982 |
| JP | A 58-202448 | 11/1983 |
| JP | A 59-19912 | 2/1984 |
| JP | A 61-044429 | 3/1986 |
| JP | A 62-65326 | 3/1987 |
| JP | A 62-183522 | 8/1987 |
| JP | A 63-157419 | 6/1988 |
| JP | A 4-065603 | 3/1992 |
| JP | A 4-305915 | 10/1992 |
| JP | A 4-305917 | 10/1992 |
| JP | A 05-021314 | 1/1993 |
| JP | A 5-62877 | 3/1993 |
| JP | A-5-129181 | 5/1993 |
| JP | A 6-053120 | 2/1994 |
| JP | A 6-124873 | 5/1994 |
| JP | A 6-188169 | 7/1994 |
| JP | A 7-176468 | 7/1995 |
| JP | A 7-220990 | 8/1995 |
| JP | A 8-37149 | 2/1996 |
| JP | A 08-130179 | 5/1996 |
| JP | A 8-166475 | 6/1996 |
| JP | A 8-316125 | 11/1996 |
| JP | A 8-330224 | 12/1996 |
| JP | A 9-232213 | 9/1997 |
| JP | A-9-260262 | 10/1997 |
| JP | A 10-154659 | 6/1998 |
| JP | A 10-163099 | 6/1998 |
| JP | A 10-214783 | 8/1998 |
| JP | A 10-303114 | 11/1998 |
| JP | A 10-340846 | 12/1998 |
| JP | A 11-016816 | 1/1999 |
| JP | A 11-135400 | 5/1999 |
| JP | A 11-176727 | 7/1999 |
| JP | A 2000-58436 | 2/2000 |
| JP | A 2000-164504 | 6/2000 |
| JP | A 2000-505958 | 7/2000 |
| JP | A 2001-510577 | 7/2001 |
| JP | A 2001-267239 | 9/2001 |
| JP | A 2002-005586 | 1/2002 |
| JP | A 2002-014005 | 1/2002 |
| JP | A 2002-071514 | 3/2002 |
| JP | A 2002-198303 | 7/2002 |
| JP | A 2002-231622 | 8/2002 |
| JP | A 2004-519850 | 7/2004 |
| JP | A 2005-51231 | 2/2005 |
| JP | A 2006-024915 | 1/2006 |
| JP | A 2006-165500 | 6/2006 |
| WO | WO 99/60361 A1 | 1/1999 |
| WO | WO 99/23692 | 5/1999 |
| WO | WO 99/28790 A1 | 6/1999 |
| WO | WO 99/49504 | 9/1999 |
| WO | WO 2001/035168 A1 | 5/2001 |
| WO | WO 03/079418 A1 | 9/2003 |
| WO | WO 2004/019128 A2 | 3/2004 |
| WO | WO 2004/055803 A1 | 7/2004 |
| WO | WO 2004/057590 A1 | 7/2004 |
| WO | WO 2005/029559 A1 | 3/2005 |
| WO | WO 2005/038888 A1 | 4/2005 |
| WO | WO 2005/071491 A2 | 8/2005 |
| WO | WO 2006/059636 A1 | 6/2006 |

OTHER PUBLICATIONS

U.S. Appl. No. 11/887,584, filed Oct. 1, 2007.
Office Action mailed Jun. 29, 2010 in U.S. Appl. No. 11/887,584.
Mar. 22, 2011 Notice of Allowance in U.S. Appl. No. 11/887,584.
May 17, 2005 International Search Report in International Application No. PCT/JP2005/001990, with translation.
May 17, 2005 Written Opinion in International Application No. PCT/JP2005/001990, with translation.
Oct. 9, 2008 Supplemental European Search Report in European Application No. 05710042.2.
Apr. 19, 2011 Office Action in Japanese Patent Application No. 2005-027377 (with English translation).
Jun. 27, 2011 Office Action issued in Korean Patent Application No. 2006-7015579 with English Translation.
Feb. 14, 2012 Office Action in Japanese Patent Application No. 2005-027377 (with English translation).
Jan. 18, 2012 Office Action in European Patent Application No. 05 710 042.2.
Korean Patent Office, Notice of Grounds for Rejection mailed May 2, 2012 in Korean Patent Application No. 2011-7031204 w/English-language Translation.

* cited by examiner

Fig. 4
(a)
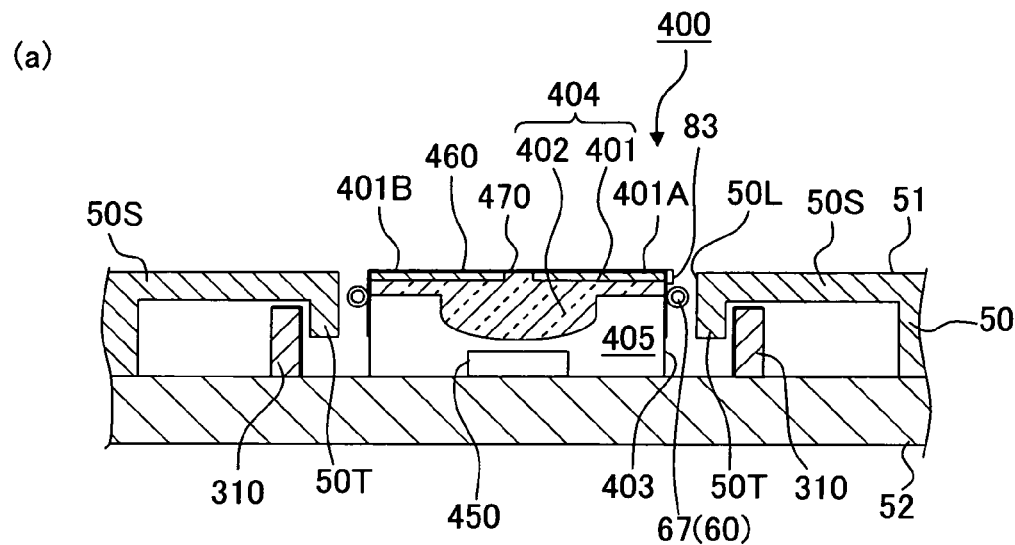
(b)
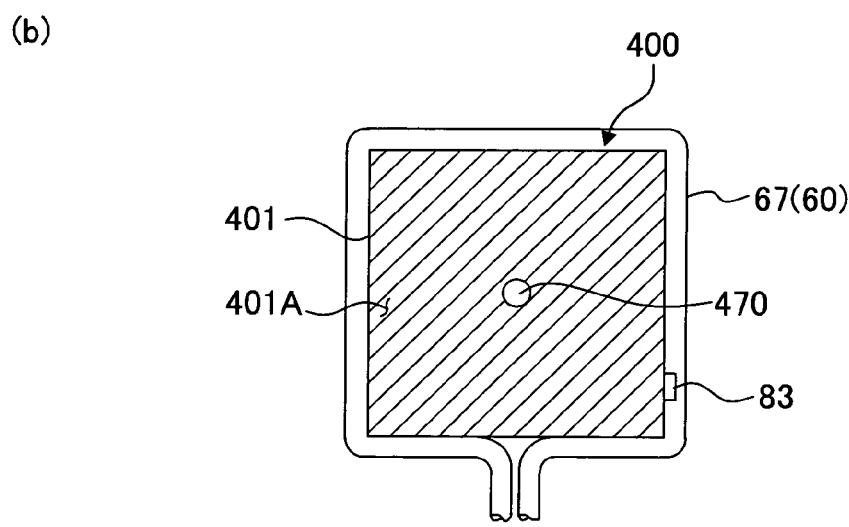

Fig. 13
(a)
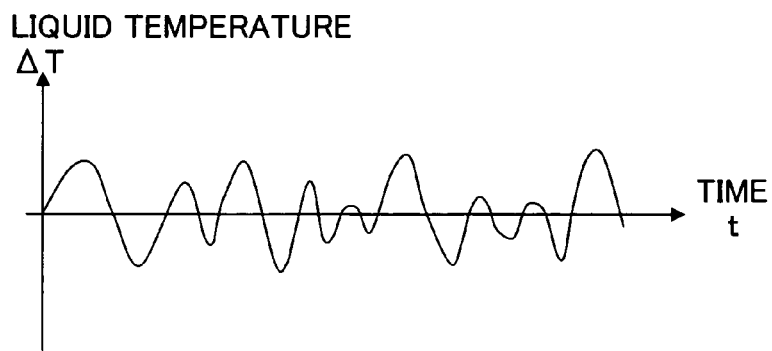
(b)
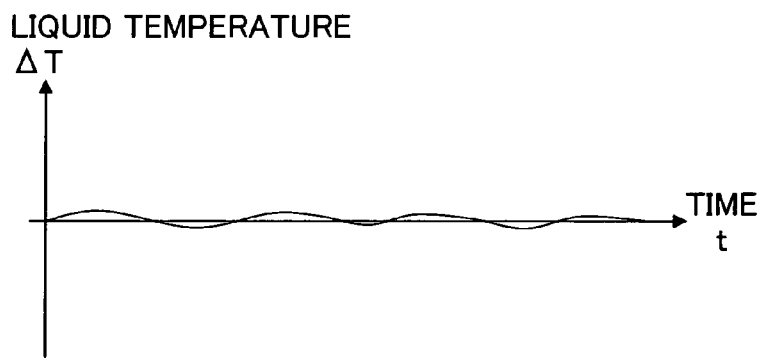
Fig. 14
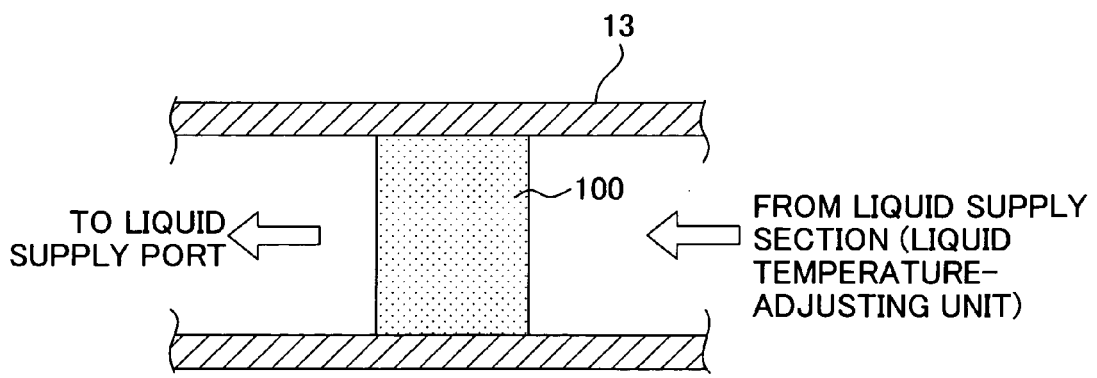

EXPOSURE APPARATUS, EXPOSURE METHOD, AND METHOD FOR PRODUCING DEVICE

TECHNICAL FIELD

The present invention relates to an exposure apparatus and an exposure method for exposing a substrate by radiating an exposure light beam onto the substrate through a liquid, and a method for producing a device based on the use of the exposure apparatus and the exposure method.

BACKGROUND ART

Semiconductor devices and liquid crystal display devices are produced by means of the so-called photolithography technique in which a pattern formed on a mask is transferred onto a photosensitive substrate. The exposure apparatus, which is used in the photolithography step, includes a mask stage for supporting the mask and a substrate stage for supporting the substrate. The pattern on the mask is transferred onto the substrate via a projection optical system while successively moving the mask stage and the substrate stage. In recent years, it is demanded to realize the higher resolution of the projection optical system in order to respond to the further advance of the higher integration of the device pattern. As the exposure wavelength to be used is shorter, the resolution of the projection optical system becomes higher. As the numerical aperture of the projection optical system is larger, the resolution of the projection optical system becomes higher. Therefore, the exposure wavelength, which is used for the exposure apparatus, is shortened year by year, and the numerical aperture of the projection optical system is increased as well. The exposure wavelength, which is dominantly used at present, is 248 nm of the KrF excimer laser. However, the exposure wavelength of 193 nm of the ArF excimer laser, which is shorter than the above, is also practically used in some situations. When the exposure is performed, the depth of focus (DOF) is also important in the same manner as the resolution. The resolution R and the depth of focus δ are represented by the following expressions respectively.

$$R = k_1 \cdot \lambda / NA \quad (1)$$

$$\delta = \pm k_2 \cdot \lambda / NA^2 \quad (2)$$

In the expressions, λ represents the exposure wavelength, NA represents the numerical aperture of the projection optical system, and $k_1$ and $k_2$ represent the process coefficients. According to the expressions (1) and (2), the following fact is appreciated. That is, when the exposure wavelength λ is shortened and the numerical aperture NA is increased in order to enhance the resolution R, then the depth of focus δ is narrowed.

If the depth of focus δ is too narrowed, it is difficult to match the substrate surface with respect to the image plane of the projection optical system. It is feared that the focus margin is insufficient during the exposure operation. Accordingly, the liquid immersion method has been suggested, which is disclosed, for example, in International Publication No. 99/49504 as a method for substantially shortening the exposure wavelength and widening the depth of focus. In this liquid immersion method, the space between the lower surface of the projection optical system and the substrate surface is filled with a liquid such as water or any organic solvent to form a liquid immersion area so that the resolution is improved and the depth of focus is magnified about n times by utilizing the fact that the wavelength of the exposure light beam in the liquid is 1/n as compared with that in the air (n represents the refractive index of the liquid, which is about 1.2 to 1.6 in ordinary cases).

In relation to the liquid immersion exposure apparatus, the following arrangement is conceived. That is, for example, when the position information about the substrate is measured, a detecting light beam is radiated onto the liquid, and the measurement is performed on the basis of the detecting light beam through the liquid. In such a situation, if the refractive index of the liquid is changed, for example, due to any temperature change, the measurement accuracy is deteriorated, for example, due to any fluctuation of the optical path for the detecting light beam. Similarly, if the refractive index of the liquid is changed, for example, due to any temperature change, the exposure accuracy is deteriorated, for example, due to any fluctuation of the image characteristic (state of formation of the image) to be obtained through the liquid.

DISCLOSURE OF THE INVENTION

The present invention has been made taking the foregoing circumstances into consideration, an object of which is to provide an exposure apparatus, an exposure method, and a method for producing a device, in which the exposure process and the measurement process can be performed satisfactorily through the liquid.

In order to achieve the object as described above, the present invention adopts the following constructions corresponding to FIGS. 1 to 16 as illustrated in embodiments.

According to a first aspect of the present invention, there is provided an exposure apparatus which exposes a substrate by radiating an exposure light beam onto the substrate through a liquid; the exposure apparatus comprising a substrate stage which has a substrate-holding member for holding the substrate and which is movable while holding the substrate by the aid of the substrate-holding member; and a temperature adjustment system which performs temperature adjustment for the substrate-holding member.

According to the present invention, the substrate, which is held by the substrate-holding member, can be adjusted to have a desired temperature by performing the temperature adjustment by using the temperature adjustment system for the substrate-holding member which holds the substrate. Therefore, the temperature change is suppressed for the liquid which makes contact with the substrate, and it is possible to maintain the liquid to be in a desired temperature state. Therefore, for example, even when the exposure apparatus is constructed such that the detecting light beam is radiated onto the liquid to perform the measurement process on the basis of the detecting light beam through the liquid, it is possible to maintain the satisfactory measurement accuracy. Further, it is possible to maintain the satisfactory exposure accuracy, because the exposure light beam can be radiated onto the substrate through the liquid which is in the desired temperature state.

According to a second aspect of the present invention, there is provided an exposure apparatus which exposes a substrate by radiating an exposure light beam onto the substrate through a liquid; the exposure apparatus comprising a temperature adjustment system which performs temperature adjustment for an optical member through which the exposure light beam passes in a state in which the optical member makes contact with the liquid.

According to the present invention, the optical member, through which the exposure light beam passes in the state in which the optical member makes contact with the liquid, is subjected to the temperature adjustment by using the temperature adjustment system. Accordingly, the temperature change is suppressed for the liquid which makes contact with the optical member, and thus it is possible to maintain the liquid to be in the desired temperature state. Therefore, for example, it is possible to maintain the satisfactory state for the exposure accuracy to be obtained when the substrate is exposed by radiating the exposure light beam onto the substrate through the liquid and the satisfactory state for the measurement accuracy in relation to the exposure light beam via the liquid and the optical member.

In this arrangement, the optical member, through which the exposure light beam passes in the state in which the optical member makes contact with the liquid, includes, for example, an optical member disposed at the end portion on the image plane side of the projection optical system in the state in which the space between the projection optical system and the substrate is filled with the liquid, when the exposure apparatus is provided with the projection optical system for projecting the image of the pattern. Further, when the exposure apparatus is provided with the projection optical system for projecting the image of the pattern and the measuring sensor arranged on the image plane side of the projection optical system, for example, the optical member includes, for example, an optical member (upper plate) which makes contact with the liquid and which is included in various types of optical members for constructing the measuring sensor, and an optical member which is disposed at the end portion on the image plane side of the projection optical system in the state in which the space between the projection optical system and the measuring sensor arranged on the image plane side thereof is filled with the liquid.

According to a third aspect of the present invention, there is provided an exposure apparatus which exposes a substrate by radiating an exposure light beam onto the substrate through a liquid; the exposure apparatus comprising a substrate stage which is movable while holding the substrate and which has a member forming a flat portion around the substrate and a temperature adjustment system which performs temperature adjustment for the member forming the flat portion.

According to the present invention, the member forming the flat portion around the substrate is subjected to the temperature adjustment by using the temperature adjustment system, and thus the temperature change of the liquid in contact with the flat portion is suppressed. It is possible to maintain the liquid to have the desired temperature.

In this arrangement, the member forming the flat portion around the substrate includes, for example, an member which forms at least a portion or part of the upper surface included in the upper surface of the substrate stage and which is provided so as to surround, for example, the substrate, an upper surface of a reference member which is used when the mask and/or the substrate is subjected to the alignment, and a member (upper plate) which makes contact with the liquid and which is included in the measuring sensor arranged on the image plane side of the projection optical system.

According to a fourth aspect of the present invention, there is provided an exposure apparatus which exposes a substrate by radiating an exposure light beam onto the substrate through a liquid; the exposure apparatus comprising a first substrate stage which has a substrate-holding member for holding the substrate and which is movable while holding the substrate by the aid of the substrate-holding member a second substrate stage which has a substrate-holding member for holding the substrate and which is movable while holding the substrate by the aid of the substrate-holding member; a measuring station which performs measurement for the substrate held by one of the stages; an exposure station which performs exposure for the substrate held by the other of the stages; and temperature adjustment systems which are provided for the first substrate stage and the second substrate stage respectively and which perform temperature adjustment for the substrate-holding member of each of the stages in the measuring station.

According to the present invention, the temperature adjustment is performed by using the temperature adjustment system for the substrate-holding member which holds the substrate in the measuring station to perform the measurement process in relation to the substrate in the so-called twin-stage type exposure apparatus provided with the first substrate stage and the second substrate stage. Accordingly, the substrate, which is held by the substrate-holding member, can be adjusted to have the desired temperature.

Therefore, even when the liquid is supplied onto the substrate in the exposure station, then it is possible to suppress the temperature change and the thermal deformation of the substrate, and it is possible to suppress the temperature change of the liquid which makes contact with the substrate as well. Thus, it is possible to maintain the satisfactory exposure accuracy.

According to a fifth aspect of the present invention, there is provided an exposure apparatus which exposes a substrate by radiating an exposure light beam onto the substrate through a liquid; the exposure apparatus comprising a liquid supply mechanism which supplies the liquid; and a temperature sensor which measures a temperature of an object that makes contact with the liquid supplied from the liquid supply mechanism; wherein the liquid supply mechanism adjusts a temperature of the liquid to be supplied on the basis of a measurement result obtained by the temperature sensor.

According to the present invention, the temperature of the object such as the substrate which makes contact with the liquid is measured, and the temperature of the liquid to be supplied is adjusted on the basis of the obtained result of the measurement. Therefore, it is possible to suppress not only the temperature change of the object, but it is also possible to suppress the temperature change of the liquid to be supplied onto the object. Thus, the temperature of the liquid can be maintained to be in the desired state. Therefore, it is possible to obtain the satisfactory measurement accuracy and the satisfactory exposure accuracy. The measurement of the temperature of the object to make contact with the liquid includes not only the case of the direct measurement of the temperature of the object, but also the case of the measurement of the temperature of the object which can be regarded to have approximately the same temperature as the temperature of the object to make contact with the liquid, and of the measurement of the temperature of the object for which the temperature of the object to make contact with the liquid can be predicted or estimated.

According to the present invention, there is provided a method for producing a device, comprising using the exposure apparatus according to any one of the aspects described above. According to the present invention, the device, which exhibits the desired performance, can be produced by using the exposure apparatus which is capable Of satisfactorily performing the exposure process and the measurement process through the liquid.

According to a sixth aspect of the present invention, there is provided an exposure method for exposing a substrate by radiating an exposure light beam onto the substrate through a liquid; the exposure method comprising adjusting a temperature of the substrate in consideration of a temperature of the liquid before starting exposure for the substrate; and exposing the substrate by radiating the exposure light beam onto the substrate through the liquid.

According to the present invention, it is possible to avoid the occurrence of the temperature distribution and the change of the temperature of the liquid with respect to the desired temperature when the substrate and the liquid make contact with each other, by adjusting the temperature of the substrate in consideration of the temperature of the liquid. Therefore, for example, the liquid, which is in contact with the substrate, can be also maintained at the desired temperature. Therefore, even when the exposure apparatus is constructed such that the detecting light beam is radiated onto the liquid to perform the measurement process on the basis of the detecting light beam through the liquid, it is possible to maintain the satisfactory measurement accuracy. Further, it is possible to maintain the satisfactory exposure accuracy, because the exposure light beam can be radiated onto the substrate through the liquid which is in the desired temperature state. Further, it is also possible to avoid the thermal deformation and the temperature change of the substrate when the substrate makes contact with the liquid. The exposure can be performed highly accurately while maintaining the satisfactory positional adjustment accuracy and the satisfactory overlay accuracy.

According to a seventh aspect of the present invention, there is provided an exposure method for exposing a substrate through a liquid; the exposure method comprising adjusting a temperature of an object which includes the substrate and makes contact with the liquid, on the basis of a predetermined temperature; and exposing the substrate through the liquid which has the predetermined temperature. In this exposure method, the temperature of the object is adjusted on the basis of the temperature (predetermined temperature) of the liquid brought about when the liquid immersion exposure is performed. Therefore, it is possible to avoid the variation of the factor which affects the image formation characteristic, including, for example, the refractive index and the temperature of the liquid, while the variation would be otherwise caused by the contact of the liquid with the object. Therefore, it is possible to guarantee the exposure accuracy of the liquid immersion exposure and the measurement accuracy before the liquid immersion exposure.

According to an eighth aspect of the present invention, there is provided an exposure method for exposing a substrate by radiating an exposure light beam onto the substrate through a liquid; the exposure method comprising supplying the liquid; and adjusting a temperature of the liquid to be supplied, on the basis of a temperature of an object which makes contact with the supplied liquid. According to this exposure method, the temperature of the supplied liquid is adjusted on the basis of the temperature of the object such as the substrate which makes contact with the liquid. Therefore, it is possible to suppress the temperature change of the object, thereby maintaining the temperature of the liquid supplied onto the object to be in the desired state.

According to the present invention, there is provided a method for producing a device, comprising using the exposure method as described above. According to the present invention, it is possible to produce the device which exhibits the desired performance, in accordance with the exposure method which makes it possible to satisfactorily perform the exposure process and the measurement process through the liquid.

BRIEF DESCRIPTION OF THE DRAWINGS

FIGS. 4(a) and 4(b) show the temperature adjustment system which performs temperature adjustment for a measuring member.

FIGS. 13(a) and 13(b) schematically illustrate the situation of the temperature change of the liquid supplied from the liquid supply mechanism.

FIG. 14 shows a member for attenuating the temperature variation of the liquid.

BEST MODE FOR CARRYING OUT THE INVENTION

The exposure apparatus according to the present invention will be explained below with reference to the drawings. However, the present invention is not limited thereto.

Figure 1:
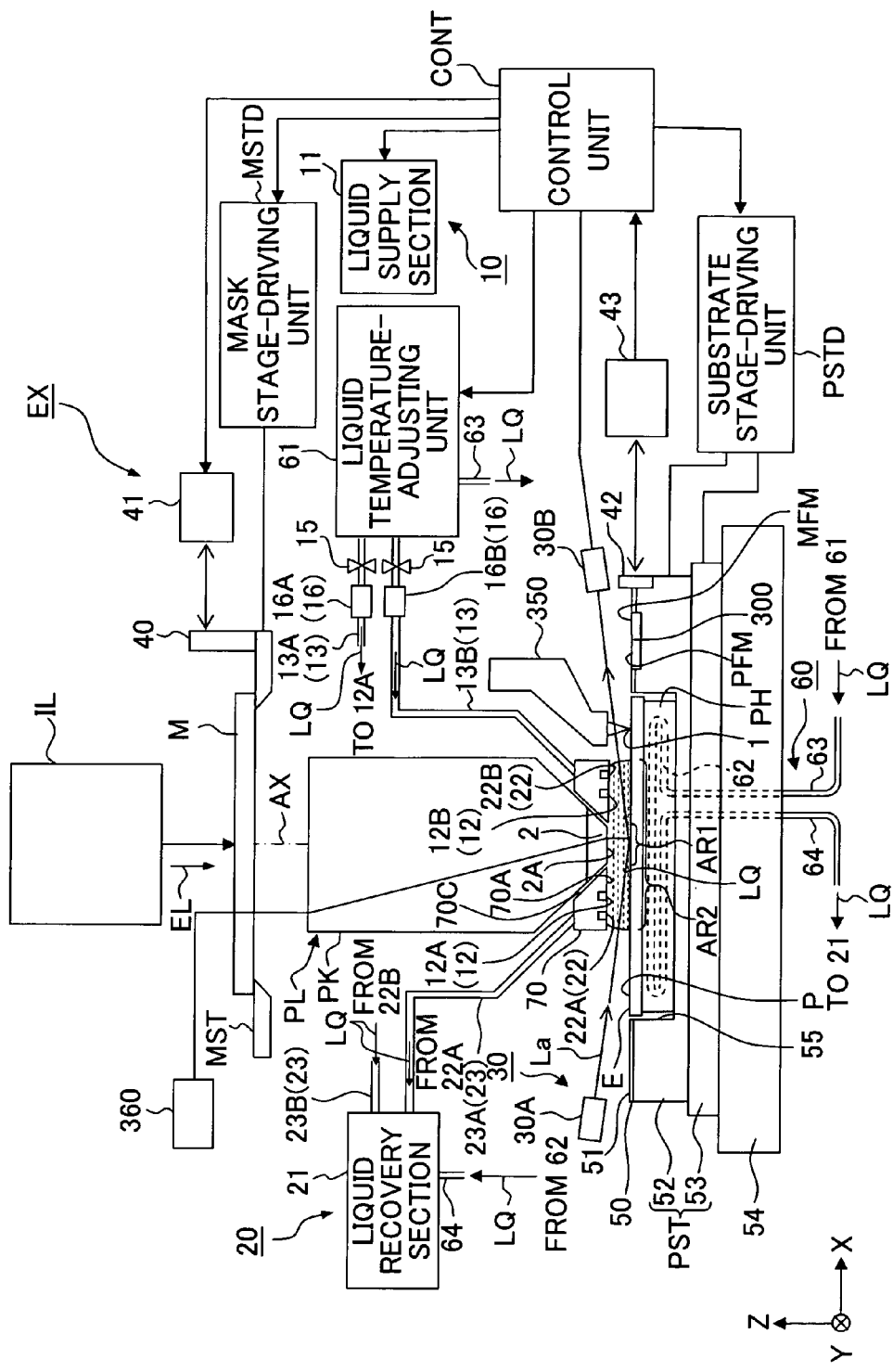
FIG. 1 shows a schematic arrangement illustrating an embodiment of an exposure apparatus of the present invention.

FIG. 1 shows a schematic arrangement illustrating an embodiment of an exposure apparatus of the present invention. With reference to FIG. 1, the exposure apparatus EX includes a mask stage MST which is movable while supporting a mask M, a substrate stage PST which has a substrate holder PH for holding a substrate P and which is movable while supporting the substrate P, an illumination optical system IL which illuminates, with an exposure light beam EL, the mask M supported by the mask stage MST, a projection optical system PL which performs the projection exposure for the substrate P supported by the substrate stage PST with an image of a pattern of the mask M illuminated with the exposure light beam EL, a temperature adjustment system 60 which performs temperature adjustment for the substrate holder PH, and a control unit CONT which integrally controls the operation of the entire exposure apparatus EX.

The exposure apparatus EX of this embodiment is a liquid immersion exposure apparatus to which the liquid immersion method is applied in order that the exposure wavelength is substantially shortened to improve the resolution and the depth of focus is substantially widened. The exposure apparatus EX includes a liquid supply mechanism 10 which supplies the liquid LQ onto the substrate P, and a liquid recovery mechanism 20 which recovers the liquid LQ from the substrate P. In this embodiment, pure water is used for the liquid LQ. The exposure apparatus EX forms a liquid immersion area AR2 locally on at least a part of the substrate P including a projection area AR1 of the projection optical system PL by the liquid LQ supplied from the liquid supply mechanism 10 at least during the period in which the image of the pattern of the mask M is transferred onto the substrate P, the liquid immersion area AR2 being larger than the projection area AR1 and smaller than the substrate P. Specifically, the exposure apparatus EX is operated as follows. That is, the space between the surface (exposure surface) of the substrate P and the optical element 2 disposed at the end portion on the image plane side of the projection optical system PL is filled with the liquid LQ. The image of the pattern of the mask M is projected onto the substrate P to expose the substrate P therewith via the projection optical system PL and the liquid LQ disposed between the projection optical system PL and the substrate P.

The embodiment of the present invention will be explained as exemplified by a case using the scanning type exposure apparatus (so-called scanning stepper) as the exposure apparatus EX in which the substrate P is exposed with the pattern formed on the mask M while synchronously moving the mask M and the substrate P in mutually different directions (opposite directions) in the scanning directions (predetermined directions). In the following explanation, the X axis direction is the synchronous movement direction (scanning direction, predetermined direction) for the mask M and the substrate P in the horizontal plane, the Y axis direction (non-scanning direction) is the direction which is perpendicular to the X axis direction in the horizontal plane, and the Z axis direction is the direction which is perpendicular to the X axis direction and the Y axis direction and which is coincident with the optical axis AX of the projection optical system PL. The directions of rotation (inclination) about the X axis, the Y axis, and the Z axis are designated as θX, θY, and θZ directions respectively. The term "substrate" referred to herein includes those obtained by coating a semiconductor wafer surface with a resist, and the term "mask" includes a reticle formed with a device pattern to be subjected to the reduction projection onto the substrate.

The illumination optical system IL is provided so that the mask M, which is supported on the mask stage MST, is illuminated with the exposure light beam EL. The illumination optical system IL includes, for example, an exposure light source, an optical integrator which uniformizes the illuminance of the light flux radiated from the exposure light source, a condenser lens which collects the exposure light beam EL emitted from the optical integrator, a relay lens system, and a variable field diaphragm which sets the illumination area on the mask M illuminated with the exposure light beam EL to be slit-shaped. The predetermined illumination area on the mask M is illuminated with the exposure light beam EL having a uniform illuminance distribution by the illumination optical system IL. Those usable as the exposure light beam EL radiated from the illumination optical system IL include, for example, emission lines (g-ray, h-ray, i-ray) radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used. As described above, the liquid LQ is pure water in this embodiment, through which even the ArF excimer laser beam as the exposure light beam EL is transmissive. Those also capable of being transmitted through pure water include the emission line (g-ray, h-ray, i-ray) and the far ultraviolet light beam (DUV light beam) such as the KrF excimer laser beam (wavelength: 248 nm).

The mask stage MST is movable while holding the mask M. The mask stage MST is two-dimensionally movable in the plane perpendicular to the optical axis AX of the projection optical system PL, i.e., in the XY plane, and it is finely rotatable in the θZ direction. The mask stage MST is driven by a mask stage-driving unit MSTD such as a linear motor. The mask stage-driving unit MSTD is controlled by the control unit CONT. A movement mirror 40, which is movable together with the mask stage MST, is provided on the mask stage MST. A laser interferometer 41 is provided at a position opposed to the movement mirror 40. The position in the two-dimensional direction and the angle of rotation of the mask M on the mask stage MST are measured in real-time by the laser interferometer 41. The result of the measurement is outputted to the control unit CONT. The control unit CONT drives the mask stage-driving unit MSTD on the basis of the result of the measurement obtained by the laser interferometer 41 to thereby position the mask M supported on the mask stage MST.

The projection optical system PL projects the pattern on the mask M onto the substrate P at a predetermined projection magnification β to perform the exposure. The projection optical system PL includes a plurality of optical elements including an optical element (lens) 2 provided at the end portion on the side of the substrate P. The optical elements are supported by a barrel PK. In this embodiment, the projection optical system PL is based on the reduction system having the projection magnification β which is, for example, ¼, ⅕, or ⅛. The projection optical system PL may be any one of the 1× magnification system and the magnifying system. The projection optical system PL may be either a projection optical system of the catoptric type including only a catoptric element or a projection optical system of the dioptric type including only a dioptric element. Alternatively, the projection optical system PL may be a projection optical system of the cata-dioptric type including catoptric and dioptric elements. The optical element 2, which is disposed at the end portion of the projection optical system PL of this embodiment, is provided detachably (exchangeably) with respect to the barrel PK. The optical element 2, which is disposed at the end portion, is exposed from the barrel PK. The liquid LQ of the liquid immersion area AR2 makes contact with the optical element 2. Accordingly, the barrel PK, which is formed of metal, is prevented from any corrosion or the like.

The optical element 2 is formed of calcium fluorite. A water-attracting (lyophilic or liquid-attracting) treatment is performed to the liquid contact surface 2A of the optical element 2 to enhance the affinity for the liquid LQ as described later on. Calcium fluorite has a high affinity for pure water. Therefore, the liquid LQ is successfully allowed to make tight contact with substantially the entire surface of the liquid contact surface 2A of the optical element 2 even when no water-attracting (lyophilic or liquid-attracting) treatment is performed. Therefore, it is also allowable to omit the water-attracting (lyophilic or liquid-attracting) treatment to be performed to the liquid contact surface 2A of the optical element 2. The optical element 2 may be formed of silica glass having a high affinity for water.

The substrate stage PST includes a Z stage 52 which holds the substrate P by the aid of a substrate holder PH, and an XY stage 53 which supports the Z stage 52. The XY stage 53 is supported on a base 54. The substrate stage PST is driven by a substrate stage-driving unit PSTD such as a linear motor. The substrate stage-driving unit PSTD is controlled by the control unit CONT. The Z stage 52 is capable of moving the substrate P held by the substrate holder PH in the Z axis direction and the θX and θY directions (in the direction of inclination). The XY stage 53 is capable of moving the substrate P held by the substrate holder PH in the XY directions (in the direction substantially in parallel to the image plane of the projection optical system PL) by the aid of the Z stage 52. It goes without saying that the Z stage and the XY stage are appropriately provided as an integrated body.

A recess 55 is provided on the substrate stage PST (Z stage 52). The substrate holder PH is arranged in the recess 55. The upper surface 51 of the substrate stage PST except for the recess 55 is a flat surface (flat portion) which has substantially the same height as that of (is flush with) the surface of the substrate P held by the substrate holder PH. In this embodiment, a plate member 50 having an upper surface 51 is arranged exchangeably on the substrate stage PST. The liquid immersion area AR2 can be formed satisfactorily while retaining the liquid LQ on the image plane side of the projection optical system PL even when the edge area E of the substrate P is subjected to the liquid immersion exposure, because the upper surface 51, which is substantially flush with the surface of the substrate P, is provided around the substrate P. However, there may be any difference in level between the surface of the substrate P and the upper surface 51 of the plate member 50, provided that the liquid immersion area AR2 can be satisfactorily maintained. For example, the upper surface 51 of the plate member 50 may be lower than the surface of the substrate P held by the substrate holder PH. A gap of about 0.1 to 2 mm is allowed between the edge portion of the substrate P and the plate member 50 having the flat surface (upper surface) 51 provided around the substrate P. However, the liquid LQ scarcely flows into the gap owing to the surface tension of the liquid LQ. Even when the exposure is performed for the portion in the vicinity of the circumferential edge of the substrate P, it is possible to retain the liquid LQ under the projection optical system PL owing to the plate member 50. In the case of the exposure apparatus shown in FIG. 1, an upper portion of a movement mirror 42 described later on is higher than the upper surface 51 of the substrate stage PST. However, it is desirable that the upper portion of the movement mirror 42 also has approximately the same height as that of (is flush with) the upper surface 51 of the substrate stage PST.

The movement mirror 42, which is movable together with the substrate stage PST with respect to the projection optical system PL, is provided on the substrate stage PST (Z stage 52). A laser interferometer 43 is provided at a position opposed to the movement mirror 42. The angle of rotation and the position in the two-dimensional direction of the substrate P on the substrate stage PST are measured in real-time by the laser interferometer 43. The result of the measurement is outputted to the control unit CONT. The control unit CONT positions the substrate P supported by the substrate stage PST in the X axis direction and the Y axis direction by driving the XY stage 53 by the aid of the substrate stage-driving unit PSTD in the two-dimensional coordinate system defined by the laser interferometer 43 on the basis of the result of the measurement performed by the laser interferometer 43.

The exposure apparatus EX has a focus-detecting system 30 for detecting the surface position information about the surface of the substrate P. The focus-detecting system 30 includes a light-emitting section 30A and a light-receiving section 30B. A detecting light beam is radiated in an oblique direction (from an obliquely upward position) from the light-emitting section 30A through the liquid LQ onto the surface (exposure surface) of the substrate P. A reflected light beam from the substrate P is received by the light-receiving section 30B through the liquid LQ. Accordingly, the focus-detecting system 30 detects the surface position information about the surface of the substrate P. The control unit CONT controls the operation of the focus-detecting system 30. Further, the control unit CONT detects the position (focus position) in the Z axis direction of the surface of the substrate P with respect to the predetermined reference surface (image plane) on the basis of the light-receiving result of the light-receiving section 30B. The focus-detecting system 30 can also determine the posture or attitude of the substrate P in the direction of inclination by determining the focus positions at a plurality of points on the surface of the substrate P respectively. A system, which is disclosed, for example, in Japanese Patent Application Laid-open No. 8-37149, can be used for the focus-detecting system 30. Another focus-detecting system may also be adopted, in which the surface information about the surface of the substrate P is detected not through the liquid LQ. In this case, the surface information about the surface of the substrate P may be detected at any position away or separated from the projection optical system PL. An exposure apparatus, in which the surface information about the surface of the substrate P is detected at any position away from the projection optical system PL, is disclosed, for example, in U.S. Pat. No. 6,674,510, contents of which are incorporated herein by reference within a range of permission of the domestic laws and ordinances of the state designated or selected in this international application.

The control unit CONT controls the position (focus position) of the substrate P held by the Z stage 52 in the Z axis direction and the position in the θX and θY directions by driving the Z stage 52 of the substrate stage PST by the aid of the substrate stage-driving unit PSTD. That is, the Z stage 52 is operated on the basis of the instruction from the control unit CONT based on the detection result of the focus-detecting system 30. The angle of inclination and the focus position (Z position) of the substrate P are controlled so that the surface (exposure surface) of the substrate P is adjusted to match the image plane to be formed via the projection optical system PL and the liquid LQ.

A substrate alignment system 350, which detects alignment marks 1 on the substrate P or a substrate side reference mark PFM on a reference member 300 provided on the Z stage 52, is provided in the vicinity of the end portion of the projection optical system PL. A mask alignment system 360, which detects a mask side reference mark MFM on the reference member 300 provided on the Z stage 52 via the mask M and the projection optical system PL, is provided in the vicinity of the mask stage MST. A structure, which is disclosed, for example, in Japanese Patent Application Laid-open No. 4-65603, can be used for the substrate alignment system 350. A structure, which is disclosed, for example, in Japanese Patent Application Laid-open No. 7-176468, can be used for the mask alignment system 360.

The liquid supply mechanism 10 supplies the predetermined liquid LQ to the image plane side of the projection optical system PL. The liquid supply mechanism 10 includes a liquid supply section 11 which is capable of feeding the liquid LQ, a liquid temperature-adjusting unit 61 which adjusts the temperature of the liquid LQ supplied from the liquid supply section 11, and supply tubes 13 (13A, 13B) each of which has one end connected to the liquid temperature-adjusting unit 61. The liquid supply section 11 includes, for example, a tank for accommodating the liquid LQ, and a pressurizing pump. The liquid supply operation of the liquid supply section 11 is controlled by the control unit CONT. The operation of the liquid temperature-adjusting unit 61 is also controlled by the control unit CONT. When the liquid immersion area AR2 is formed on the substrate P, the liquid LQ, which is controlled to have the desired temperature, is supplied onto the substrate P by the liquid supply mechanism 10. It is not necessarily indispensable that the exposure apparatus EX is provided with the tank and the pressurizing pump of the liquid supply section 11 which may be replaced with the equipment of the factory or the like in which the exposure apparatus EX is installed.

Valves 15, which open/close the flow passages of the supply tubes 13A, 13B, are provided at intermediate positions of the supply tubes 13A, 13B respectively. The operation for opening/closing the valves 15 is controlled by the control unit CONT. In this embodiment, the valves 15 are the so-called normally closed system in which the flow passages of the supply tubes 13A, 13B are mechanically closed when the driving source (power source) of the exposure apparatus EX is stopped, for example, due to the power failure.

The liquid recovery mechanism 20 recovers the liquid LQ on the image plane side of the projection optical system PL. The liquid recovery mechanism 20 includes a liquid recovery section 21 which is capable of recovering the liquid LQ, and recovery tubes 23 (23A, 23B) each of which has one end connected to the liquid recovery section 21. The liquid recovery section 21 includes, for example, a vacuum system (suction unit) such as a vacuum pump, a gas/liquid separator for separating the gas from the recovered liquid LQ, and a tank for accommodating the recovered liquid LQ. As for the vacuum system, it is also allowable to use a vacuum system of the factory in which the exposure apparatus EX is installed, instead of providing the vacuum pump for the exposure apparatus EX. The liquid recovery operation of the liquid recovery section 21 is controlled by the control unit CONT. In order to form the liquid immersion area AR2 on the substrate P, the liquid recovery mechanism 20 recovers a predetermined amount of the liquid LQ from the surface of the substrate P supplied from the liquid supply mechanism 10.

A flow passage-forming member 70 is arranged in the vicinity of the optical element 2 which makes contact with the liquid LQ and which is included in the plurality of optical elements for constructing the projection optical system PL. The flow passage-forming member 70 is an annular member having the opening 70C (light-transmitting portion) which is formed at the central portion of the flow passage-forming member 70. The optical element 2 is accommodated in the opening 70C. That is, the flow passage-forming member 70 is provided to surround the side surface of the optical element 2, over the substrate P (substrate stage PST). A gap is provided between the flow passage-forming member 70 and the optical element 2. The flow passage-forming member 70 is supported by a predetermined support mechanism so that the flow passage-forming member 70 is isolated from the optical element in terms of vibration.

The flow passage-forming member 70 can be formed of, for example, aluminum, titanium, stainless steel, duralumin, or any alloy containing the above. Alternatively, the flow passage-forming member 70 may be formed of a transparent member (optical member) such as glass (silica glass) having the light transmittance.

The flow passage-forming member 70 is provided with liquid supply ports 12 (12A, 12B) which are provided over or above the substrate P (substrate stage PST) and which are arranged to be opposed to the surface of the substrate P. In this embodiment, the flow passage-forming member 70 has two liquid supply ports 12A, 12B. The liquid supply ports 12A, 12B are provided on the lower surface 70A of the flow passage-forming member 70.

The flow passage-forming member 70 has supply flow passages formed therein to correspond to the liquid supply ports 12A, 12B. A plurality of (two) supply tubes 13A, 13B are provided to correspond to the liquid supply ports 12A, 12B and the supply flow passages. One end of each of the supply flow passages of the flow passage-forming member 70 is connected to the liquid supply section 11 via each of the supply tubes 13A, 13B. The other end is connected to each of the liquid supply ports 12A, 12B.

Flow rate controllers 16 (16A, 16B), each of which is called "mass flow controller" and which control the liquid supply amounts per unit time with respect to the liquid supply ports 12A, 12B respectively after the liquid is fed from the liquid supply section 11, are provided at intermediate positions of the two supply tubes 13A, 13B respectively. The flow rate controllers 16A, 16B control the liquid supply amounts under the instruction signal fed from the control unit CONT.

The flow passage-forming member 70 further includes liquid recovery ports 22 (22A, 22B) which are provided over or above the substrate P (substrate stage PST) and which are arranged to be opposed to the surface of the substrate P. In this embodiment, the flow passage-forming member 70 has two liquid recovery ports 22A, 22B. The liquid recovery ports 22A, 22B are provided on the lower surface 70A of the flow passage-forming member 70.

The flow passage-forming member 70 has recovery flow passages formed therein to correspond to the liquid recovery ports 22A, 22B. A plurality of (two) recovery tubes 23A, 23B are provided to correspond to the liquid recovery ports 22A, 22B and the recovery flow passages. One end of each of the recovery flow passages of the flow passage-forming member 70 is connected to the liquid recovery section 21 via each of the recovery tubes 23A, 23B. The other end is connected to each of the liquid recovery ports 22A, 22B.

In this embodiment, the flow passage-forming member 70 constructs parts of the liquid supply mechanism 10 and the liquid recovery mechanism 20 respectively. The liquid supply ports 12A, 12B, which construct the liquid supply mechanism 10, are provided at the positions on the both sides in the X axis direction respectively while interposing the projection area AR1 of the projection optical system PL. The liquid recovery ports 22A, 22B, which construct the liquid recovery mechanism 20, are provided outside the liquid supply ports 12A, 12B of the liquid supply mechanism 10 in relation to the projection area AR1 of the projection optical system PL. In this embodiment, the projection area AR1 of the projection optical system PL is set to have a rectangular shape in a plan view in which the Y axis direction is the longitudinal direction and the X axis direction is the transverse direction.

The operations of the liquid supply section 11 and the flow rate controllers 16 are controlled by the control unit CONT. When the liquid LQ is supplied onto the substrate P, then the control unit CONT feeds the liquid LQ from the liquid supply section 11, and the liquid LQ is supplied onto the substrate P from the liquid supply ports 12A, 12B provided over the substrate P through the supply tubes 13A, 13B and the supply flow passages. In this arrangement, the liquid supply ports 12A, 12B are arranged on the both sides respectively with the projection area AR1 of the projection optical system PL intervening therebetween. The liquid LQ can be supplied from the both sides of the projection area AR1 by the aid of the liquid supply ports 12A, 12B. The amounts per unit time of the liquid LQ to be supplied onto the substrate P from the liquid supply ports 12A, 12B respectively can be individually controlled by the flow rate controllers 16A, 16B provided for the supply tubes 13A, 13B respectively.

The liquid recovery operation of the liquid recovery section 21 is controlled by the control unit CONT. The control unit CONT can control the liquid recovery amount per unit time brought about by the liquid recovery section 21. The liquid LQ on the substrate P, recovered through the liquid recovery ports 22A, 22B provided over the substrate P, is recovered by the liquid recovery section 21 through the recovery tubes 23A, 23B and the recovery flow passages of the flow passage-forming member 70.

In this embodiment, the supply tubes 13A, 13B are connected to one liquid supply section 11. However, a plurality of (for example, two) liquid supply sections 11 may be provided corresponding to the number of the supply tubes, and the respective supply tubes 13A, 13B may be connected to the plurality of liquid supply sections 11 respectively. On the other hand, the recovery tubes 23A, 23B are connected to one liquid recovery section 21. However, a plurality of (for example, two) liquid recovery sections 21 may be provided corresponding to the number of the recovery tubes, and the respective recovery tubes 23A, 23B may be connected to the plurality of liquid recovery sections 21 respectively.

The liquid contact surface 2A of the optical element 2 of the projection optical system PL and the lower surface (liquid contact surface) 70A of the flow passage-forming member 70 have the lyophilicity or liquid-attracting property (hydrophilicity). In this embodiment, the liquid-attracting treatment is performed to the liquid contact surfaces of the optical element 2 and the flow passage-forming member 70. The liquid contact surfaces of the optical element 2 and the flow passage-forming member 70 have the liquid-attracting property owing to the liquid-attracting treatment. In other words, at least the liquid contact surfaces, which are included in the surfaces of the members disposed opposite to the exposure objective surface (surface) of the substrate P held by the substrate stage PST, are liquid-attractive. In this embodiment, the liquid LQ is water having the large polarity. Therefore, as for the liquid-attracting treatment (water-attracting or hydrophilic treatment), for example, a thin film is formed with a substance such as alcohol having the molecular structure with the large polarity. Accordingly, the liquid-attracting property is given to the liquid contact surfaces of the optical element 2 and the flow passage-forming member 70. That is, it is desirable to adopt such a treatment that the substance having the molecular structure with the large polarity such as the OH group is provided on the liquid contact surface, when water is used as the liquid LQ. Alternatively, a liquid-attracting material such as $MgF_2$, $Al_2O_3$, and $SiO_2$ may be provided on the liquid contact surface.

The lower surface (surface directed to the substrate P) 70A of the flow passage-forming member 70 is a substantially flat surface, and the lower surface (liquid contact surface) 2A of the optical element 2 is a flat surface as well. The lower surface 70A of the flow passage-forming member 70 is substantially flush with the lower surface 2A of the optical element 2. Accordingly, the liquid immersion area AR2 can be satisfactorily formed in a wide range. It is not necessarily indispensable that the lower surface 70A of the flow passage-forming member 70 is substantially flush with the lower surface 2A of the optical element 2. It is enough that the liquid immersion area is formed in a desired range.

The mechanism, which forms the liquid immersion area AR2 on the object (for example, the substrate P) opposed to the projection optical system PL, is not limited to the mechanism described above. For example, it is possible to use a mechanism disclosed in United States Patent Publication No. 2004/0207824, contents of which are incorporated herein by reference within a range of permission of the domestic laws and ordinances of the state designated or selected in this international application.

A vibration sensor (for example, an acceleration sensor) is provided for the projection optical system PL and/or the flow passage-forming member 70. It is possible to monitor the vibration of the projection optical system PL which may be generated due to the contact with the liquid LQ and/or the vibration of the flow passage-forming member 70 which may be generated when the liquid LQ is recovered.

Figure 2:
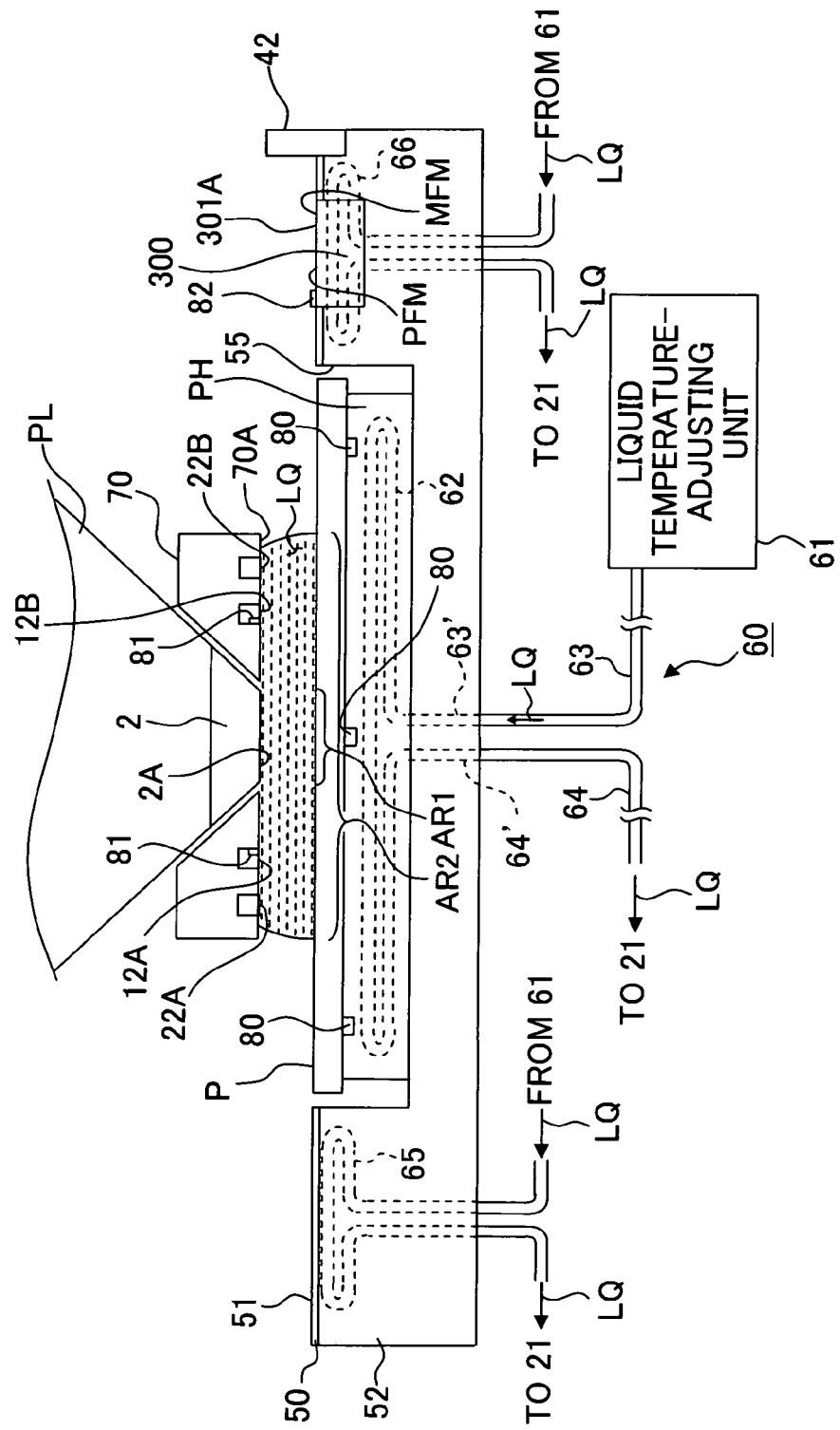
FIG. 2 shows a magnified side view illustrating main parts to depict a substrate stage and a temperature adjustment system.

FIG. 2 shows the temperature adjustment system 60 which performs the temperature adjustment for the substrate holder PH. With reference to FIG. 2, the temperature adjustment system 60 includes the liquid temperature-adjusting unit 61 which adjusts the temperature of the liquid LQ supplied from the liquid supply section 11 to be a predetermined temperature, and a temperature-adjusting flow passage 62 which is formed in the substrate holder PH and through which the liquid LQ supplied from the liquid temperature-adjusting unit 61 flows. One end of the temperature-adjusting flow passage 62 is connected to the liquid temperature-adjusting unit 61 via a supply flow passage 63 and an internal flow passage 63' which is formed in the Z stage 52. The other end of the temperature-adjusting flow passage 62 is connected to the liquid recovery section 21 via a recovery flow passage 64 and an internal flow passage 64' which is formed in the Z stage 52. The liquid LQ, which is subjected to the temperature adjustment by the liquid temperature-adjusting unit 61, is supplied to the temperature-adjusting flow passage 62 via the supply flow passage 63 and the internal flow passage 63', and the liquid LQ is allowed to flow through the temperature-adjusting flow passage 62. The liquid temperature-adjusting unit 61 includes therein a heater and a temperature sensor. The liquid temperature-adjusting unit 61 is controlled on the basis of the control signal supplied from the control unit. The temperature of the liquid LQ is not specifically limited. However, the temperature of the liquid LQ is regulated or adjusted to about 23° C.±0.01 which is approximately the same as the temperature in the chamber in which, for example, the projection optical system PL and the substrate stage PST are accommodated. The substrate holder PH is adjusted to have a desired temperature, for example, the same temperature as that of the adjusted liquid LQ, by the aid of the liquid LQ allowed to flow through the temperature-adjusting flow passage 62.

The temperature-adjusting flow passage 62 is provided to have a helical form or a wavy form as viewed in a plan view in the Z direction. The temperature-adjusting flow passage 62 is capable of adjusting the substrate holder PH to have an approximately uniform temperature. This embodiment has been explained such that one temperature-adjusting flow passage 62 is provided. However, it is also allowable to provide a plurality of temperature-adjusting flow passages 62 for the substrate holder PH. This embodiment has been explained such that the temperature-adjusting flow passage 62 is formed in the substrate holder PH. However, the temperature-adjusting flow passage 62 may be provided under or below the substrate holder PH (on the contact surface between the substrate holder PH and the Z stage 52) or in the Z stage 52. Alternatively, a tube member, which forms the temperature-adjusting flow passage 62, may be provided on the circumference of the side surface of the substrate holder PH. Further alternatively, the temperature-adjusting flow passage 62 may be provided at any position on the upper surface of the substrate holder PH provided that the position, at which the temperature-adjusting flow passage 62 is provided, does not inhibit the holding of the substrate P.

The substrate holder PH is preferably formed of a material having a high coefficient of thermal conductivity so that the substrate holder PH is subjected to the temperature control in accordance with the temperature of the liquid allowed to flow through the temperature-adjusting flow passage 62. The substrate holder PH may be formed of, for example, aluminum, titanium, stainless steel, duralumin, or any alloy containing the above. A plurality of pin-shaped projections are formed on the upper surface of the substrate holder PH in order to hold the substrate P. In this embodiment, the substrate P is formed of silicon carbide (SiC) having a high coefficient of thermal conductivity. Therefore, the substrate P, which is held by the substrate holder PH, can be regarded to have approximately the same temperature as the temperature of the substrate holder PH. The temperature of the substrate P can be adjusted by adjusting the temperature of the substrate holder PH.

The supply flow passage 63, which connects the liquid temperature-adjusting unit 61 and the internal flow passage 63', can be constructed, for example, with a flexible tube which is elastically deformable in accordance with the movement of the substrate stage PST. The recovery flow passage 64, which connects the liquid recovery section 21 and the internal flow passage 64', can be also constructed with a flexible tube.

In this embodiment, the temperature adjustment system 60 performs the temperature adjustment for the substrate holder PH by using a liquid LQ which is same as the liquid LQ to be supplied onto the substrate P. The temperature adjustment system 60 uses the temperature-adjusted liquid LQ to perform the temperature adjustment for the substrate holder PH and perform the temperature adjustment for the liquid LQ for the liquid immersion exposure to be supplied onto the substrate P as well. Accordingly, the structure of the apparatus is simplified, and the temperature change can be suppressed for the substrate P to make contact with the liquid LQ and for the liquid LQ to make contact with the substrate P respectively. Further, approximately the same temperature can be ensured for the substrate holder PH, the substrate P held by the substrate holder PH, and the liquid LQ to make contact with the substrate P.

The temperature adjustment system 60 can also perform the temperature adjustment for the plate member 50 which forms the flat surface (upper surface) 51 around the substrate P. As shown in FIG. 2, a temperature-adjusting flow passage 65 is provided in the inside of the Z stage 52 disposed below the plate member 50. The temperature-adjusted liquid LQ, which is supplied from the liquid temperature-adjusting unit 61, is allowed to flow through the temperature-adjusting flow passage 65. Accordingly, the temperature of the plate member 50 is adjusted. The temperature-adjusting flow passage 65 may be provided in the plate member 50 and/or around the plate member 50. Further, a temperature-adjusting flow passage 66 is also provided in the reference member 300 or around (or below) the reference member 300. The reference member 300 is subjected to the temperature adjustment by the liquid LQ which is supplied from the liquid temperature-adjusting unit 61 and which is allowed to flow through the temperature-adjusting flow passage 66. The temperature-adjusting flow passages 65, 66 may be provided at any position on the members 50, 300 respectively, provided that the position does not inhibit the measurement process and the exposure process. Accordingly, even when the liquid immersion area AR2 is formed on the plate member 50 and/or the reference member 300, the temperature change is suppressed for the plate member 50, the reference member 300, and the liquid LQ respectively by controlling the temperatures of the plate member 50 and the reference member 300 as described above. The temperature of the plate member 50 can be made approximately identical with the temperature of the liquid LQ, and/or the temperature of the reference member 300 can be made approximately identical with the temperature of the liquid LQ.

Temperature sensors 80, which measures the temperature of the substrate holder PH, are provided at a plurality of predetermined positions of the upper surface of the substrate holder PH respectively. As described above, the substrate holder PH can be regarded to have approximately the same temperature as that of the substrate P. Therefore, the temperature sensors 80, which are provided on the upper surface of the substrate holder PH, can also measure the temperature of the substrate P held by the substrate holder PH. The result of the temperature measurement performed by the temperature sensors 80 is outputted to the control unit CONT. The result of the measurement performed by the temperature sensors 80 is used, for example, for the temperature control of the liquid LQ by the liquid temperature-adjusting unit 61. In this arrangement, the control unit CONT can control the liquid temperature-adjusting unit 61, for example, such that the difference is decreased between the measurement result of the temperature sensors 80 and the temperature of the liquid to be supplied onto the substrate P.

When it is impossible to regard that the temperature of the substrate holder PH is the same as the temperature of the substrate P, then the temperature of the substrate holder PH may be measured with the temperature sensors 80, and the temperature of the substrate P to make contact with the liquid LQ may be estimated on the basis of the measurement result. Of course, the temperature sensors 80 may be arranged at positions at which the temperature of the substrate P can be directly measured.

The temperature of the substrate P may be estimated, for example, on the basis of any experiment and/or any simulation, instead of providing the temperature sensors 80.

Temperature sensors 81, which measure the temperature of the liquid LQ supplied from the liquid supply ports 12A, 12B to the image plane side of the projection optical system PL, are provided in the vicinity of the liquid supply ports 12A, 12B of the flow passage-forming member 70 respectively. The result of the temperature measurement performed by the temperature sensors 81 is outputted to the control unit CONT. The result of the measurement performed by the temperature sensors 81 is used, for example, for the temperature control of the liquid LQ by the liquid temperature-adjusting unit 61. In this arrangement, for example, the control unit CONT can compare the result of the measurement performed by the temperature sensors 81 with the preset temperature of the liquid to control the liquid temperature-adjusting unit 61 so that the difference between these temperatures is decreased. It is enough that the temperature sensors 81 are arranged at the positions at which the temperature of the liquid LQ supplied to the image plane side of the projection optical system PL can be measured. The temperature sensors 81 can be provided at arbitrary positions of the flow passage-forming member 70 and/or the optical element 2, for example, provided that the temperature sensors 81 make contact with the liquid LQ at the positions. Alternatively, the temperature sensors 81 may be provided at intermediate positions of the supply tubes and/or the recovery tubes and the flow passages in the flow passage-forming member 70.

Further, a temperature sensor 82, which measures the temperature of the reference member 300, is provided at a predetermined position of the reference member 300. In this embodiment, the temperature sensor 82 is provided at the position on the upper surface 301A of the reference member 300 at which the measuring operation for the reference marks MFM, PFM or the like is not inhibited. The temperature sensor 82 can be provided at any arbitrary position provided that the temperature of the reference member 300 can be measured at the position. The result of the temperature measurement performed by the temperature sensor 82 is also outputted to the control unit CONT. The measurement result of the temperature sensor 82 is used, for example, for the temperature control of the liquid LQ by the liquid temperature-adjusting unit 61 when the liquid immersion area AR2 is formed on the reference member 300. In this arrangement, for example, the control unit CONT can control the liquid temperature-adjusting unit 61 so that the difference between the measured value obtained by the temperature sensor 82 and the temperature of the liquid LQ to be supplied onto the reference member 300 is decreased.

The temperature of the reference member 300 may be estimated, for example, on the basis of any experiment and/or any simulation, instead of providing the temperature sensor 82.

Figure 3:
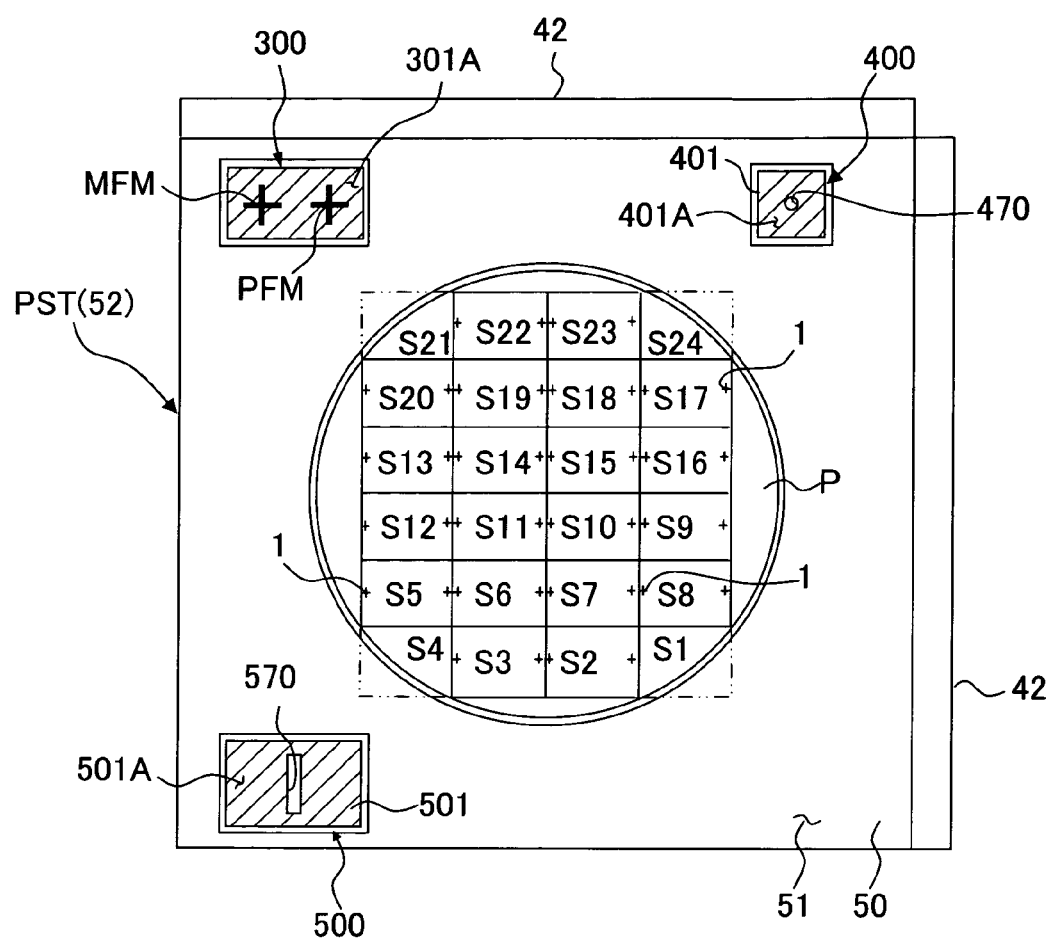
FIG. 3 shows a plan view illustrating the substrate stage as viewed from an upper position.

FIG. 3 shows a plan view, as viewed from an upper position, illustrating the substrate stage PST which is movable while holding the substrate P. With reference to FIG. 3, movement mirrors 42 are arranged at two edge portions of the substrate stage PST which is rectangular as viewed in a plan view, the two edge portions being perpendicular to each other.

The upper surface 51 of the substrate stage PST is subjected to the liquid-repelling treatment to have the liquid-repelling property. Those adoptable as the liquid-repelling treatment for the upper surface 51 include, for example, the coating with a liquid-repelling material such as fluorine-based resin materials and acrylic resin materials, and the sticking of a thin film formed of the liquid-repelling material as described above. A material, which is insoluble in the liquid LQ, is used as the liquid-repelling material to provide the liquid repellence. A part or all of the substrate stage PST may be formed of, for example, a material having the liquid repellence represented by fluorine-based resins such as polytetrafluoroethylene (Teflon™). The plate member 50 may be formed of a material having the liquid repellence such as polytetrafluoroethylene as described above.

The reference member 300 is arranged at the predetermined position outside the substrate P on the substrate stage PST. A reference mark PFM to be detected by the substrate alignment system 350 (FIG. 1) and a reference mark MFM to be detected by the mask alignment system 360 (FIG. 1) are provided in a predetermined positional relationship on the reference member 300. An upper surface 301A of the reference member 300 is a substantially flat surface. The upper surface 301A of the reference member 300 is provided to have approximately the same height as those of (to be flush with) the upper surface 51 of the plate member 50 and the surface of the substrate P held by the substrate stage PST. The upper surface 301A of the reference member 300 can also play a role as the reference surface for the focus-detecting system 30. The reference mark PFM and the reference mark MFM may be provided on separate members to be arranged on the substrate stage PST.

The substrate alignment system 350 also detects the alignment marks 1 formed on the substrate P. As shown in FIG. 3, a plurality of shot areas S1 to S24 are formed on the substrate P. The plurality of alignment marks 1 are provided on the substrate P corresponding to the plurality of shot areas S1 to S24. In FIG. 3, the respective shot areas are depicted so that they are adjacent to one another. However, the respective shot areas are actually separated from each other. The alignment marks 1 are provided on scribe lines as separation areas therebetween.

An uneven illuminance sensor 400, which is as disclosed, for example, in Japanese Patent Application Laid-open No. 57-117238, is arranged as a measuring sensor at a predetermined position outside the substrate P on the substrate stage PST. The uneven illuminance sensor 400 is provided with an upper plate 401 which is rectangular as viewed in a plan view. The upper surface 401A of the upper plate 401 is a substantially flat surface. The upper surface 401A of the upper plate 401 is provided to have approximately the same height as those of (to be flush with) the upper surface 51 of the plate member 50 and the surface of the substrate P held by the substrate stage PST. A pinhole 470, through which the light beam is transmissive, is provided through the upper surface 401A of the upper plate 401. Portions of the upper surface 401A except for the pinhole 470 are covered with a light-shielding material such as chromium.

A spatial image-measuring sensor 500, which is as disclosed, for example, in Japanese Patent Application Laid-open No. 2002-14005, is provided as a measuring sensor at a predetermined position outside the substrate P on the substrate stage PST. The spatial image-measuring sensor 500 is provided with an upper plate 501 which is rectangular as viewed in a plan view. The upper surface 501A of the upper plate 501 is a substantially flat surface. The upper surface 501A of the upper plate 501 is provided to have approximately the same height as those of (to be flush with) the upper surface 51 of the plate member 50 and the surface of the substrate P held by the substrate stage PST. A slit 570, through which the light beam is passable, is provided through the upper surface 501A of the upper plate 501. Portions of the upper surface 501A except for the slit 570 are covered with a light-shielding material such as chromium.

Although not shown, a radiation amount sensor (illuminance sensor), which is as disclosed, for example, in Japanese Patent Application Laid-open No. 11-16816, is also provided on the substrate stage PST. The upper surface of the upper plate of the radiation amount sensor is provided to have approximately the same height as those of (to be flush with) the upper surface 51 of the plate member 50 and the surface of the substrate P held by the substrate stage PST.

As described above, each of the upper surface 301A of the reference member 300, the upper surface 401A of the uneven illuminance sensor 400, and the upper surface 501A of the spatial image-measuring sensor 500 forms a part of the upper surface of the substrate stage PST. The substrate stage PST, which holds the substrate P, has approximately the same height (to be flush).

The reference member 300 and the upper plates 401, 501 or the like are detachable (exchangeable) with respect to the substrate stage PST. Further, the temperatures of the upper plates 401, 501 are also adjusted by the temperature adjustment system 60.

It is not necessarily indispensable that all of the measuring members such as the reference member 300 and the sensors 400, 500 are provided in the substrate stage PST as described above. At least a part or parts of them may be omitted. The measuring member, which is to be provided in the substrate stage PST, is not limited to those described above. It is also possible to provide, for example, a sensor for measuring the wavefront aberration of the projection optical system PL, if necessary. Of course, it is also allowable that no measuring member is provided in the substrate stage PST at all.

FIG. 4(a) shows a sectional view illustrating the uneven illuminance sensor 400, and FIG. 4(b) shows a plan view illustrating the uneven illuminance sensor 400 as viewed from an upper position. With reference to FIG. 4, the uneven illuminance sensor 400 includes an upper plate 401 which is formed of silica glass or the like, and an optical element 402 which is formed of silica glass or the like provided below the upper plate 401. In this embodiment, the upper plate 401 and the optical element 402 are provided as an integrated body. In the following description, the upper plate 401 and the optical element 402 will be appropriately referred to as "optical member 404" in combination. The upper plate 401 and the optical element 402 are supported on the Z stage 52 by the aid of a support portion 403. The support portion 403 has a continuous wall portion to surround the optical member 404. The uneven illuminance sensor 400 is arranged in an opening 50L provided for the plate member 50, and the upper surface 401A is exposed. The optical member 404, which includes the upper plate 401 and the optical element 402, is detachable and exchangeable with respect to the Z stage 52.

The pinhole 470, through which the light beam is passable, is provided on the upper plate 401. A thin film 460, which contains a light-shielding material such as chromium, is provided at portions of the upper plate 401 except for the pinhole 470. In this embodiment, an optical member, which is formed of silica glass, is also provided in the pinhole 470. Accordingly, the thin film 460 is flush with the pinhole 470, and the upper surface 401A is the flat surface. A film 401B, which is formed of a liquid-repelling material, is provided on parts of the upper surface 401A and the support portion 403.

It is also allowable that a part of the optical member is not provided in the pinhole 470 provided that the surface of the film 401B is substantially flush. The upper plate 401 may be omitted, and the thin film 460 may be directly formed on the optical element 402.

An optical sensor 450, which receives the light beam passed through the pinhole 470, is arranged below the optical member 404. The optical sensor 450 is attached on the Z stage 52. The optical sensor 450 outputs the light-receiving signal to the control unit CONT. In this arrangement, a space 405, which is surrounded by the support portion 403, the Z stage 52, and the optical member 404, is a substantially tightly closed space. The liquid LQ does not inflow into the space 405. An optical system (optical element) may be arranged between the optical member 404 and the optical sensor 450.

A predetermined gap is provided between the opening 50L and the uneven illuminance sensor 400 including the optical member 404 and the support portion 403. The upper surface 401A of the uneven illuminance sensor 400 is a substantially flat surface. The upper surface 401A of the uneven illuminance sensor 400 is provided to have approximately the same height as those of (to be flush with) the upper surface 51 of the plate member 50 and the surface of the substrate P.

The portion of the plate member 50, which is disposed in the vicinity of the uneven illuminance sensor 400, is thinned. The end portion of a thin-walled portion 50S subjected to the thinning, which is disposed on the side of the uneven illuminance sensor 400, is bent downwardly to form a bent portion 50T. A wall portion 310, which protrudes upwardly, is formed for the Z stage 52. The wall portion 310 is provided outside the bent portion 50T with respect to the uneven illuminance sensor 400. The wall portion 310 is formed continuously to surround the uneven illuminance sensor 400 (including the bent portion 50T).

A tube member, which constructs a temperature-adjusting flow passage 67, is provided to be wound around the side surface of the optical member 404. The temperature-adjusted liquid LQ, which is supplied from the liquid temperature-adjusting unit 61, is flowed through the temperature-adjusting flow passage 67, and thus the temperature of the optical member 404 is adjusted. The temperature of the liquid LQ can be made substantially the same as the temperature of the optical member 404 by controlling the temperature of the optical member 404 as described above even when the liquid immersion area AR2 is formed on the optical member 404.

A temperature sensor 83, which measures the temperature of the optical member 404, is provided at a predetermined position of the optical member 404. In this embodiment, the temperature sensor 83 is provided on the side surface of the optical member 404. However, the temperature sensor 83 may be provided at any arbitrary position provided that the temperature can be measured at the position. The result of the measurement of the temperature performed by the temperature sensor 83 is outputted to the control unit CONT. The measurement result obtained by the temperature sensor 83 is used, for example, for the temperature control of the liquid LQ by the liquid temperature-adjusting unit 61 when the liquid immersion area AR2 is formed on the optical member 404. In this arrangement, the control unit CONT can control the temperature adjustment for the liquid LQ by the liquid temperature-adjusting unit 61 so that the difference is decreased between the measurement result obtained by the temperature sensor 83 and the temperature of the liquid LQ to be supplied onto the optical member 404.

The temperature of the optical member 404 may be estimated, for example, on the basis of the result of any experiment and/or any simulation, without providing the temperature sensors 83.

The spatial image-measuring sensor 500 is basically constructed substantially equivalently to the uneven illuminance sensor 400. Therefore, any detailed explanation thereof will be omitted. However, a temperature-adjusting flow passage is also provided on the side surface of an upper plate (optical member) 501 for constructing the spatial image-measuring sensor 500. The temperature-adjusted liquid LQ is made to flow through the temperature-adjusting flow passage, and thus the temperature is adjusted for the upper plate 501 which constructs the spatial image-measuring sensor. Similarly, the temperature is also adjusted for the upper plate which constructs the uneven illuminance sensor, by the liquid LQ made to flow through the temperature-adjusting flow passage. A tube member, which forms the temperature-adjusting flow passage, may be wound around the side surface of the reference member 300 to adjust the temperature of the reference member 300 in the same manner as in the uneven illuminance sensor 400. Similarly, a temperature sensor, which measures the temperature of each of the optical members, is arranged for each of the spatial image-measuring sensor 500 and the unillustrated illuminance sensor. The measurement result obtained thereby is outputted to the control unit CONT. The measurement result obtained by each of the temperature sensors is used, for example, for the control of the temperature of the liquid by the liquid temperature-adjusting unit 61.

In the arrangement explained above, the temperature adjustment is performed for all of the measuring members (reference member 300, uneven illuminance sensor 400, spatial image-measuring sensor 500) provided in the substrate stage PST. However, it is also allowable to omit the temperature adjustment for at least a part or parts of the measuring members.

Figure 5:
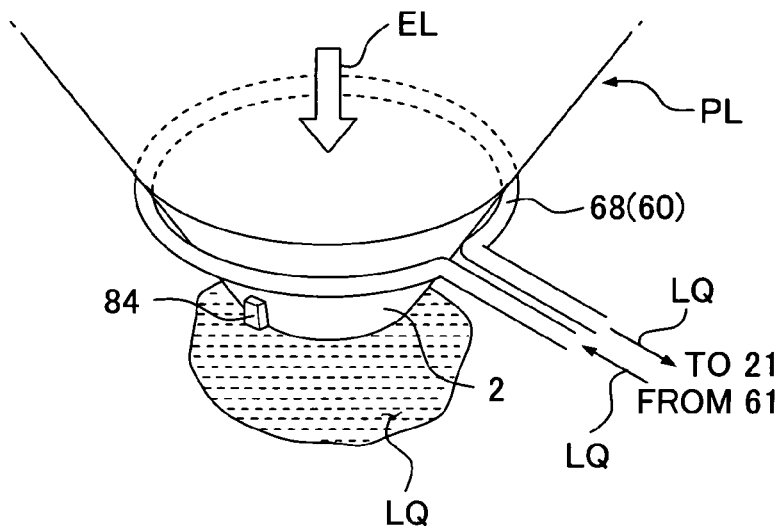
FIG. 5 shows the temperature adjustment system which performs temperature adjustment for an optical element through which an exposure light beam passes.

The temperature adjustment system 60 can also perform the temperature adjustment for the optical element 2 which makes contact with the liquid LQ and which is included in the plurality of optical elements for constructing the projection optical system PL. As shown in FIG. 5, the temperature adjustment system 60 includes a tube member for forming a temperature-adjusting flow passage 68 provided to be wound around the side surface of the optical element 2. The temperature-adjusted liquid LQ, which is supplied from the liquid temperature-adjusting unit 61, is allowed to flow through the temperature-adjusting flow passage 68. The optical element 2 is subjected to the temperature adjustment by the liquid LQ made to flow through the temperature-adjusting flow passage 68. The temperature change can be suppressed for the optical element 2 and the liquid LQ respectively by controlling the temperature of the optical element 2 as described above when the liquid immersion area AR2 is formed on the image plane side of the projection optical system PL. Further, the temperature of the optical element 2 can be made substantially the same as the temperature of the liquid LQ.

A temperature sensor 84, which measures the temperature of the optical element 2, is provided at a predetermined position of the optical element 2. In this embodiment, the temperature sensor 84 is provided on the side surface of the optical element 2. However, the temperature sensor 84 can be provided at any arbitrary position provided that the temperature of the optical element 2 can be measured at the position. The temperature measurement result of the temperature sensor 84 is also outputted to the control unit CONT. The measurement result of the temperature sensor 84 is used for the temperature adjustment for the liquid LQ by the liquid temperature-adjusting unit 61.

As described above, in this embodiment, the temperature of the liquid LQ is adjusted, and the temperature adjustment is performed for the object (for example, substrate P, reference member 300, optical element 2) to make contact with the liquid LQ. Accordingly, the temperature of the object (for example, substrate P, reference member 300, optical element 2) to make contact with the liquid LQ can be made substantially the same as the temperature of the liquid LQ. Further, it is possible to suppress not only the temperature change of the liquid LQ but also the temperature change and the thermal deformation of the object (for example, substrate P, reference member 300, optical element 2) to make contact with the liquid LQ.

In this embodiment, the temperature adjustment system 60 performs the temperature adjustment for the substrate holder PH, the reference member 300, and/or the optical element 2 by using the liquid LQ supplied from one liquid temperature-adjusting unit 61. Alternatively, at least one liquid temperature-adjusting unit may be provided separately from the liquid temperature-adjusting unit 61 which performs the temperature adjustment for the liquid LQ to be supplied to the image plane side of the projection optical system PL. For example, the liquid LQ for effecting the temperature adjustment for the optical element 2 and the liquid LQ for effecting the temperature adjustment for the substrate holder PH may be supplied from the mutually distinct liquid temperature-adjusting units respectively. That is, the temperatures of, for example, the substrate P (substrate holder PH), the liquid LQ, the reference member 300, and the optical element 2 can be independently controlled by using the individual liquid temperature-adjusting units. In this arrangement, the temperatures of, for example, the substrate P (substrate holder PH), the liquid LQ, the reference member 300, and the optical element 2 can be adjusted respectively depending on the temperature of the liquid LQ to be supplied to the image plane side of the projection optical system PL. Accordingly, it is possible to avoid the occurrence of the temperature change and the temperature distribution in the liquid LQ which would be otherwise caused by the contact with, for example, the substrate P, the reference member 300, and the optical element. Further, it is also possible to avoid the temperature change and the thermal deformation of, for example, the substrate P, the reference member 300, and the optical element 2 which would be otherwise caused by the contact with the liquid LQ. The temperature adjustment, which is effected, for example, for the substrate P (substrate holder PH), the reference member 300, and the optical element 2, is not limited to the arrangement or system in which the liquid is used. The temperature adjustment may be effected by using a predetermined temperature-adjusting means (for example, heater or Peltier element) other than the arrangement or system in which the liquid LQ is used.

Figure 6:
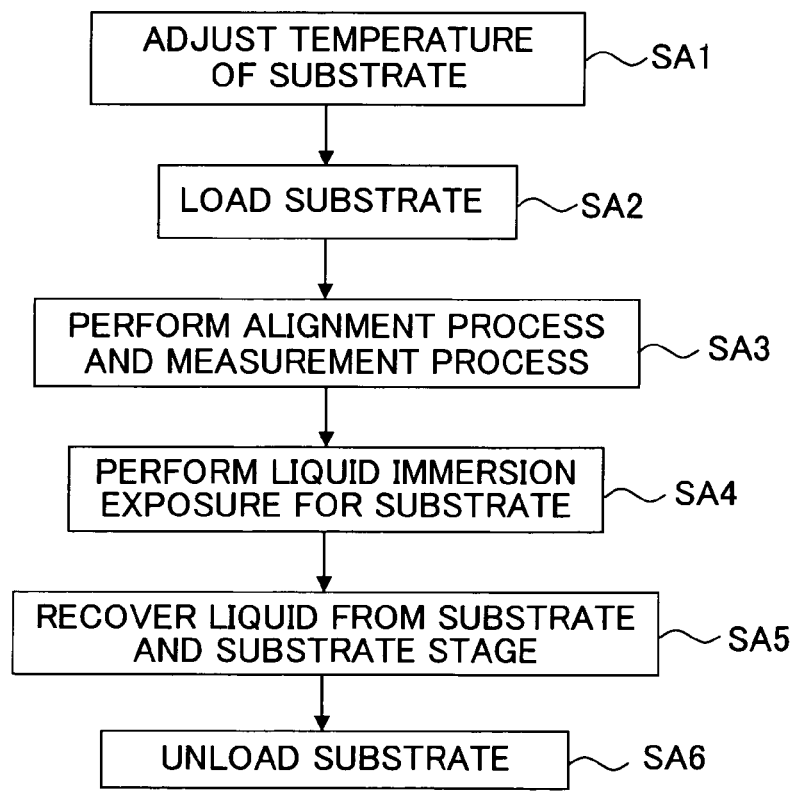
FIG. 6 shows a flow chart illustrating an exemplary exposure method according to the present invention.

Next, an explanation will be made with reference to a flow chart shown in FIG. 6 about a method for exposing the substrate P with the image of the pattern of the mask M by using the exposure apparatus EX constructed as described above.

At first, the temperature adjustment is performed for the substrate P before the substrate P is loaded on the substrate stage PST which is movable while holding the substrate (Step SA1).

Figure 7:
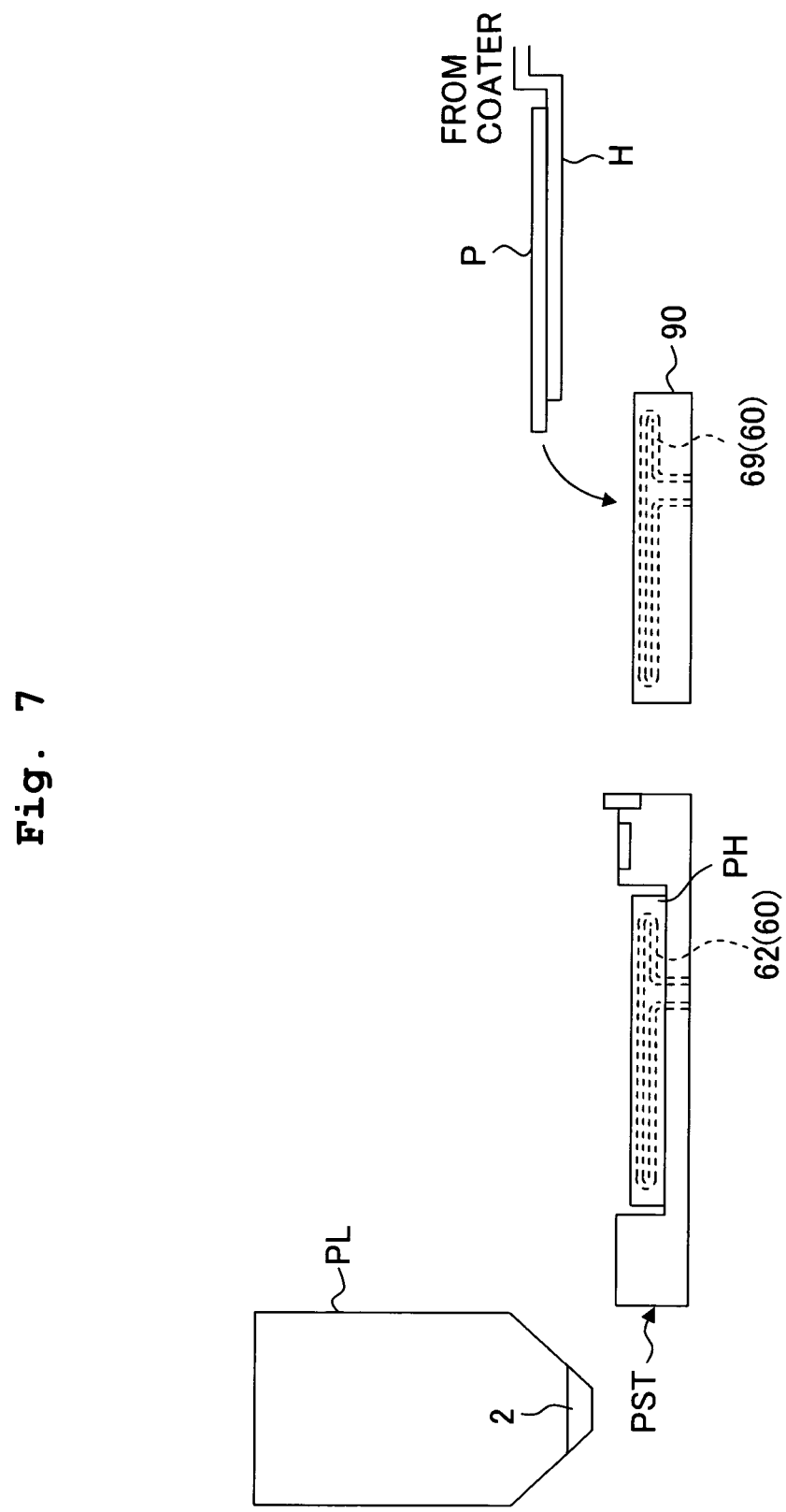
FIG. 7 shows the temperature adjustment system which performs temperature adjustment for a substrate before being loaded on a substrate holder.

Specifically, as shown in FIG. 7, the substrate P as the exposure process objective is transported onto a temperature-adjusting holder 90 which constitutes a part of the temperature adjustment system 60, by a transport system H from a pretreatment unit such as a coater unit for coating the substrate P with a resist. The temperature-adjusting holder 90 is provided between the substrate stage PST and the pretreatment unit such as the coater unit. The temperature-adjusting holder 90 adjusts the temperature of the held substrate P. In this embodiment, a temperature-adjusting flow passage 69, through which the liquid LQ supplied from the liquid temperature-adjusting unit 61 is made to flow, is formed in the temperature-adjusting holder 90. The substrate P, which is held by the temperature-adjusting holder 90, is adjusted to have the temperature corresponding to the temperature of the liquid LQ to be supplied onto the substrate P during the liquid immersion exposure, specifically, approximately the same temperature as that of the liquid LQ. Accordingly, even when the liquid LQ is supplied after the substrate P is placed on the substrate stage PST (substrate holder PH), the heat exchange is suppressed between the liquid LQ and the substrate P. It is possible to avoid the temperature change of the liquid LQ as well as the temperature change and the thermal deformation of the substrate P. In this embodiment, the substrate holder PH is also subjected to the temperature control with the liquid LQ supplied from the liquid temperature-adjusting unit 61. Therefore, it is also possible to avoid the temperature change and the thermal deformation of the substrate P when the substrate P is placed on the substrate holder PH. The liquid, which is used for the temperature-adjusting holder 90, may be supplied from a temperature-adjusting unit which is distinct from the liquid temperature-adjusting unit 61. Alternatively, the temperature adjustment may be performed for the substrate P in accordance with another system in which the liquid is not used. For example, the temperature adjustment may be performed with a temperature-adjusted gas in place of the liquid. In this arrangement, the temperature-adjusted gas may be supplied to the temperature-adjusting flow passage 69 provided in the temperature-adjusting holder 90. Alternatively, the temperature-adjusted gas may be directly blown against the temperature-adjusting holder 90 or the substrate P. Another temperature adjustment system may also be adopted, in which the temperature adjustment is performed for the temperature-adjusting holder 90 by using a contact type heater of the heat transfer system or a non-contact type heater using the heat radiation.

When the temperature-adjusting holder 90 uses any temperature-adjusting unit which is distinct from the liquid temperature-adjusting unit 61 or any temperature-adjusting mechanism in which the liquid is not used, the temperature adjustment is also performed for the substrate P on the temperature-adjusting holder 90 in consideration of the temperature of the liquid LQ to be supplied onto the substrate P and the temperature of the substrate holder PH. For example, when the temperature sensor 81 for measuring the temperature of the liquid LQ and/or the temperature sensor 80 for measuring the temperature of the substrate holder PH is provided, it is possible to control the temperature adjustment for the substrate P on the temperature-adjusting holder 90 on the basis of the measurement result obtained thereby. Accordingly, it is possible to suppress the temperature change of the liquid LQ which makes contact with the substrate P as well as the temperature change and the thermal deformation of the substrate P.

The control unit CONT uses a predetermined transport system to export the substrate P from the temperature-adjusting holder 90 and import (load) the substrate P into (on) the substrate stage PST after the temperature of the substrate P is subjected to the temperature adjustment with the temperature-adjusting holder 90 before starting the exposure for the substrate P (Step SA2).

After the substrate P is loaded on the substrate stage PST, the measurement process and the alignment process for the substrate P are performed (Step SA3).

The temperature adjustment is also performed for the liquid LQ by the temperature adjustment system 60 during the measurement process and during the alignment process.

In the measurement process, the control unit CONT supplies and recovers the liquid LQ by using the liquid supply mechanism 10 and the liquid recovery mechanism 20, for example, in a state in which the projection optical system PL is opposed to the upper plate 401 of the uneven illuminance sensor 400 to form the liquid immersion area of the liquid LQ between the optical element 2 disposed at the end portion of the projection optical system PL and the upper surface 401A of the upper plate 401.

The control unit CONT radiates the exposure light beam EL from the illumination optical system IL in a state in which the liquid LQ is allowed to make contact with the optical element 2 of the projection optical system PL and the upper surface 401A of the upper plate 401 to detect the illuminance distribution of the exposure light beam EL in the projection area AR1 by the uneven illuminance sensor 400 via the projection optical system PL and the liquid LQ. That is, the pinhole 470 of the uneven illuminance sensor 400 is successively moved to a plurality of positions in the radiation area (projection area) irradiated with the exposure light beam EL in the state in which the liquid immersion area of the liquid LQ is formed on the upper surface 401A of the uneven illuminance sensor 400. The control unit CONT appropriately corrects the illuminance distribution of the exposure light beam EL so that the illuminance distribution of the exposure light beam EL is in a desired state in the projection area AR1 of the projection optical system PL, on the basis of the result of the detection performed by the uneven illuminance sensor 400.

In this process, the temperature adjustment system 60 performs the temperature adjustment for the upper plate 401 and the optical element 2 through which the exposure light beam EL passes in the state in which the upper plate 401 and the optical element 2 make contact with the liquid LQ. Specifically, the temperature adjustment system 60 performs the temperature adjustment so that any temperature change is not caused in the optical element 2 and the upper plate 401 for forming the flat surface 401A. Further, the temperature adjustment system 60 performs the temperature adjustment for the upper plate 401 in order to suppress the temperature change of the liquid LQ on the flat surface 401A.

The temperature of the optical element 2 is measured by the temperature sensor 84 during the measurement performed by the uneven illuminance sensor 400 through the liquid LQ. The result of the measurement is outputted to the control unit CONT. Similarly, the temperature of the upper plate 401 is measured by the temperature sensor 83, and the temperature of the liquid LQ on the upper plate 401 is measured by the temperature sensor 81. The measurement results obtained by the temperature sensors 81, 83, 84 are outputted to the control unit CONT. The control unit CONT performs the temperature adjustment on the basis of the measurement results obtained by the temperature sensors so that approximately the same temperature is ensured for the liquid LQ, the optical element 2, and the upper plate 401 in order to suppress the temperature change of the upper plate 401, the optical element 2, and/or the liquid LQ. For example, the control unit CONT adjusts the liquid supply amount per unit time and/or the temperature of the liquid LQ to be supplied from the liquid temperature-adjusting unit 61 to each of the temperature-adjusting flow passage 67 for effecting the temperature adjustment for the upper plate 401 and the temperature-adjusting flow passage 68 for effecting the temperature adjustment for the optical element 2, on the basis of the measurement results obtained by the temperature sensors respectively.

When any difference appears between the temperature of the optical element 2 and the temperature of the upper plate 401 which makes contact with the liquid LQ, and/or when any difference appears between the temperature of the liquid LQ and the temperature of the upper plate 401 or the optical element 2, then the heat exchange (heat transfer) is effected therebetween. As a result, any temperature distribution appears and/or any temperature change appears in the liquid LQ with which the space between the upper plate 401 and the optical element 2 is filled. There is also such a possibility that the upper plate 401 and/or the optical element 2 may undergo the temperature change. In such a situation, there is a possibility such that the measurement accuracy may be deteriorated by the temperature change when the illuminance distribution of the exposure light beam EL is measured. Accordingly, the temperature adjustment system 60 is used to effect the temperature adjustment to prevent any temperature change from arising for the optical element 2, the upper plate 401, and the liquid LQ. Thus, it is possible to avoid the deterioration of the measurement accuracy.

There is also such a possibility that the temperature of the liquid LQ supplied from the liquid temperature-adjusting unit 61 may be slightly changed with time. Also in such a situation, the temperature distribution and the temperature change arise for the liquid LQ with which the space between the upper plate 401 and the optical element 2 is filled. Accordingly, the temperature adjustment system 60 performs the temperature adjustment for the optical element 2 and the upper plate 401 depending on the temperature of the liquid LQ to be supplied onto the upper plate 401 (on the basis of the result of the measurement performed by the temperature sensor). Thus, it is possible to avoid the inconvenience of the occurrence of the temperature distribution in the liquid LQ.

After the completion of the detection of the illuminance distribution of the exposure light beam EL, the control unit CONT uses the liquid recovery mechanism 20 to recover the liquid LQ of the liquid immersion area AR2 formed on the upper surface 401A of the upper plate 401 of the uneven illuminance sensor 400.

The explanation has been made such that the temperature adjustment is performed by the temperature adjustment system 60 during the measurement through the liquid LQ by using the uneven illuminance sensor 400. However, it is of course possible to adjust the temperatures of the optical element 2 and the upper plate 401 before the measurement process through the liquid LQ by using the uneven illuminance sensor 400. After waiting for the arrival at the desired temperature of the optical element 2, the upper plate 401, and/or the liquid LQ, the measurement process may be performed through the liquid LQ by using the uneven illuminance sensor 400.

The explanation has been made above about the measuring operation with the uneven illuminance sensor 400. The temperature adjustment is also performed by the temperature adjustment system 60 in the same manner as described above during the measuring operation and before the measuring operation through the liquid LQ by using the spatial image-measuring sensor 500 and the illuminance sensor.

Subsequently, the baseline amount is measured, as performed in one of the procedures of the measurement process. The baseline amount indicates the positional relationship between the projection position of the image of the pattern and the detection reference position of the substrate alignment system 350 in the coordinate system defined by the laser interferometer. At first, the control unit CONT moves the XY stage 53 (FIG. 1) so that the detection area of the substrate alignment system 350 is positioned on the reference member 300. Before the substrate alignment system 350 detects the reference mark PFM on the reference member 300, the temperature adjustment system 60 allows the liquid LQ to flow, for example, through the temperature-adjusting flow passage 66 and the temperature-adjusting flow passage 65 so that the temperature adjustment is effected for the upper surface of the substrate stage PST including the reference member 300.

Figure 8:
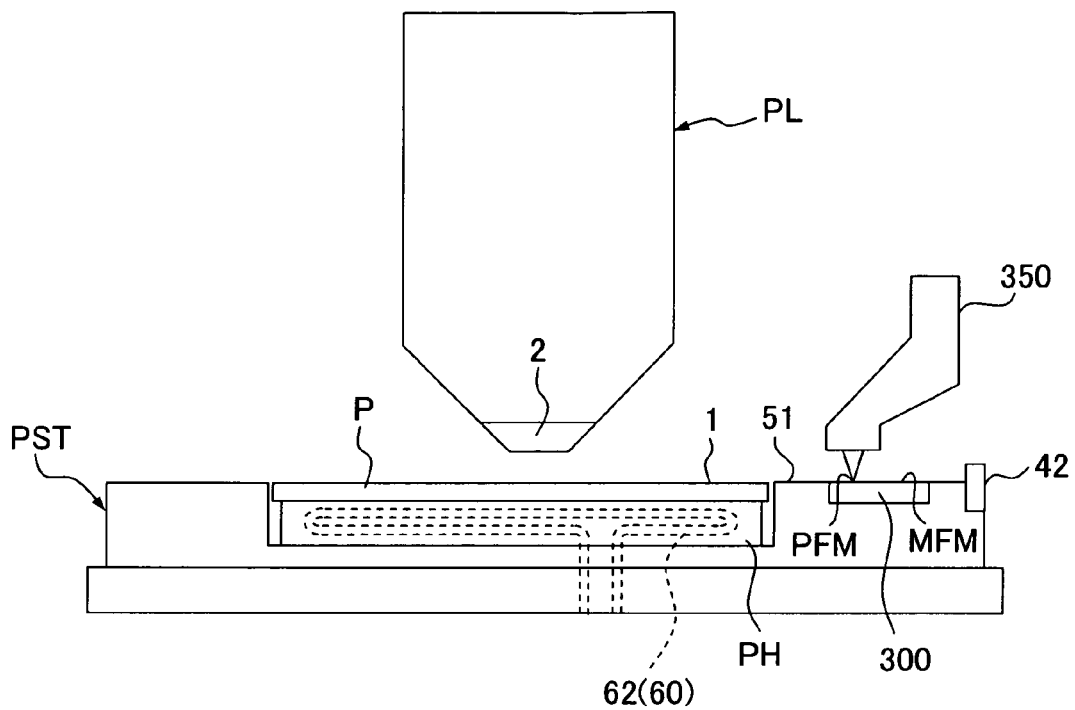
FIG. 8 illustrates the measuring operation of a mark-detecting system.

When the reference mark PFM on the reference member 300 is detected by the substrate alignment system 350, as shown in FIG. 8, the control unit CONT detects the reference mark PFM on the reference member 300 having been subjected to the temperature adjustment, by using the substrate alignment system 350 not through the liquid LQ (in the dry state) to detect the position information of the reference mark PFM in the coordinate system defined by the laser interferometer 43 (FIG. 1). Accordingly, the detection reference position of the substrate alignment system 350 in the coordinate system defined by the laser interferometer 43 is detected by using the reference mark PFM.

The temperature adjustment system 60 may perform the temperature adjustment for the reference member 300 by allowing the liquid LQ to flow, for example, through the temperature-adjusting flow passage 65 and the temperature-adjusting flow passage 66 so that the temperature change of the reference member 300 is not caused during the detecting operation performed by the substrate alignment system 350 as well.

Subsequently, the control unit CONT detects the reference mark MFM on the reference member 300 by the mask alignment system 360. When the reference mark MFM is detected, the control unit CONT moves the XY stage 53 so that the end portion of the projection optical system PL is opposed to the reference member 300. The control unit CONT supplies and recovers the liquid LQ by the liquid supply mechanism 10 and the liquid recovery mechanism 20 so that the space between the optical element 2 disposed at the end portion of the projection optical system PL and the upper surface 301A of the reference member 300 is filled with the liquid LQ to form the liquid immersion area.

The temperature adjustment system 60 performs the temperature adjustment for the upper surface of the substrate stage PST including the reference member 300 by allowing the liquid LQ to flow, for example, through the temperature-adjusting flow passage 66 and the temperature-adjusting flow passage 65 before the mask alignment system 360 detects the reference mark MFM on the reference member 300. Similarly, the temperature adjustment system 60 performs the temperature adjustment for the optical element 2 of the projection optical system PL by allowing the liquid LQ to flow through the temperature-adjusting flow passage 68.

Figure 9:
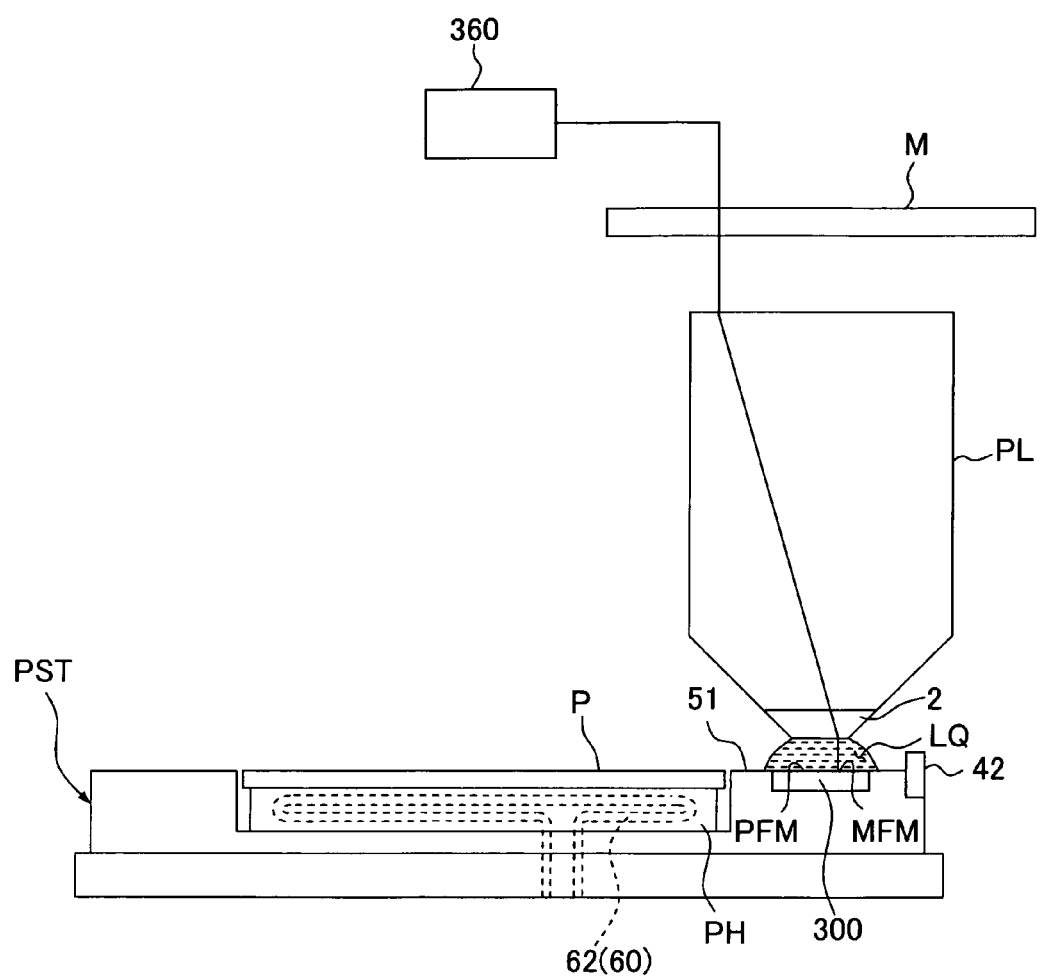
FIG. 9 illustrates the measuring operation of the mark-detecting system.

When the reference mark MFM on the reference member 300 is detected by using the mask alignment system 360, as shown in FIG. 9, the control unit CONT performs the detection of the reference mark MFM on the reference member 300, i.e., the detection of the positional relationship between the mark on the mask M and the reference mark MFM on the reference member 300 via the mask M, the projection optical system PL, and the liquid LQ (in the wet state) by the mask alignment system 360. Accordingly, the information about the projection position of the image of the pattern of the mask M is detected by using the reference mark MFM in the coordinate system defined by the laser interferometer 43.

The temperature adjustment system 60 also performs the temperature adjustment so that the temperature change is not caused for the optical element 2, the reference member 300, and/or the liquid LQ during the detecting operation performed by the mask alignment system 360. When the temperature adjustment is performed before the measuring operation or during the measuring operation of the mask alignment system 360, the temperature adjustment system 60 also performs the temperature adjustment so that the approximately the same temperature is ensured for the liquid LQ, the reference member 300, and the optical element 2, on the basis of the measurement results obtained, for example, by the temperature sensors 81, 82, 84. When the temperature adjustment is performed for the optical element 2, the reference member 300, and the liquid LQ as described above, it is possible to avoid the change of the optical characteristic and the thermal deformation of the optical element 2 due to the temperature change, the thermal deformation of the reference member 300, and the temperature change of the liquid LQ. Thus, it is possible to accurately detect the reference marks PFM, MFM.

After the completion of the detection of the reference mark MFM, the control unit CONT recovers the liquid LQ of the liquid immersion area AR2 formed on the upper surface 301A of the reference member 300 by using the liquid recovery mechanism 20 or another predetermined liquid recovery mechanism provided separately from the liquid recovery mechanism 20.

Subsequently, the control unit CONT starts the alignment process. The control unit CONT determines the baseline amount which is the spacing distance (positional relationship) between the detection reference position of the substrate alignment system 350 and the projection position of the image of the pattern. Specifically, the positional relationship (baseline amount) between the detection reference position of the substrate alignment system 350 and the projection position of the image of the pattern in the coordinate system defined by the laser interferometer 43 is determined on the basis of the detection reference position of the substrate alignment system 350, the projection position of the image of the pattern, and the predetermined positional relationship between the reference mark PFM and the reference mark MFM.

The control unit CONT detects the alignment marks 1 formed on the shot areas S1 to S24 as the exposure objective areas on the substrate P by the substrate alignment system 350 not through the liquid LQ (in the dry state) in order to perform the overlay exposure for the substrate P. The position of the substrate stage PST, which is brought about when the substrate alignment system 350 detects the alignment mark 1, is measured by the laser interferometer 43. The obtained measurement result is outputted to the control unit CONT. The control unit CONT determines the position information (deviation) of each of the shot areas S1 to S24 with respect to the detection reference position of the substrate alignment system 350 to determine, from the position of the substrate stage PST at that time, the alignment information (arrangement information) of each of the shot areas S1 to S24 in the coordinate system defined by the laser interferometer 43. It is not necessarily indispensable that all of the alignment marks formed in attendance on the shot areas S1 to S24 are detected. It is also allowable to determine the alignment information about the shot areas S1 to S24 by detecting a part or parts of the alignment marks as disclosed, for example, in Japanese Patent Application Laid-open No. 61-44429 (U.S. Pat. No. 4,780,617).

Alternatively, the surface position information about the surface of the substrate P may be detected not through the liquid LQ (in the dry state) by the focus-detecting system 30 concurrently with the detection of the alignment mark 1 on the substrate P by the substrate alignment system 350. In this case, the detection result of the focus-detecting system 30 is stored in the control unit CONT while being corresponded to the position on the substrate P.

The temperature adjustment system 60 also allows the liquid LQ to flow, for example, through the temperature-adjusting flow passage 62 and the temperature-adjusting flow passage 65 so that the temperature adjustment is effected for the substrate stage PST including the substrate holder PH during the detection and before the detection of the alignment mark 1 on the substrate P by the substrate alignment system 350 not through the liquid LQ. The temperature adjustment system 60 suppresses the temperature change of the substrate P held by the substrate holder PH by effecting the temperature adjustment for the substrate holder PH. The substrate alignment system 350 detects the alignment mark 1 on the substrate P held by the substrate holder PH having being subjected to the temperature adjustment.

As described above, the temperature adjustment system 60 can perform the temperature adjustment for the substrate P, the reference member 300, the measuring members such as the upper plates 401, 501, and the optical element 2 concurrently with the alignment process and the measurement process after the substrate P is loaded on the substrate stage PST. For example, when the substrate P is subjected to the temperature adjustment, then the substrate holder PH may be subjected to the temperature adjustment as described above, and the substrate P may be subjected to the temperature adjustment as well by the aid of the temperature-adjusted substrate holder PH. Alternatively, the substrate P can be also subjected to the temperature adjustment such that the temperature-adjusted liquid LQ, which is to be used for the exposure for the substrate P, is supplied from the supply ports 12 onto the substrate P without performing the temperature adjustment for the substrate holder PH or concurrently with the temperature adjustment performed for the substrate holder. When the temperature adjustment is performed for the substrate P before the substrate alignment system 350 detects, for example, the alignment mark 1 on the substrate P held on the substrate stage PST, then it is possible to avoid the thermal deformation of the substrate P as well as the positional deviation of the alignment mark 1, and it is possible to improve the mark detection accuracy. When the temperature adjustment is performed by supplying the liquid LQ onto the substrate P, the substrate alignment system 350 detects the alignment mark 1 not through the liquid LQ after the liquid LQ is recovered from the surface of the substrate P by the liquid recovery mechanism 20. When the upper surface of the substrate stage PST is sufficiently wide, the following procedure may also be adopted. That is, the alignment mark on the substrate P is detected not through the liquid LQ by the substrate alignment system 350 while retaining the liquid LQ on the image plane side of the projection optical system PL. Also in this case, the substrate P (substrate holder PH) and the liquid LQ are subjected to the temperature adjustment by the temperature adjustment system 60. Therefore, even when a part or all of the liquid immersion area is formed on the substrate P during the detection of the alignment mark by the substrate alignment system 350, then the substrate P does not cause any thermal deformation (thermal expansion and contraction), and the position information of the alignment mark on the substrate P can be accurately detected.

After the alignment marks 1 on the substrate P are detected by the substrate alignment system 350, the control unit CONT drives the liquid supply mechanism 10 to supply the liquid LQ onto the substrate P and derives the liquid recovery mechanism 20 to recover a predetermined amount of the liquid LQ from the surface of the substrate P in order to perform the liquid immersion exposure for the substrate P. Accordingly, the liquid immersion area AR2 of the liquid LQ is formed between the substrate P and the optical element 2 disposed at the end portion of the projection optical system PL.

As described above, in this embodiment, the liquid LQ is absent on the substrate P during the detection of the alignment marks 1 by the substrate alignment system 350, and the liquid LQ is supplied onto the substrate P by the liquid supply mechanism 10 after the detection of the alignment marks 1 by the substrate alignment system 350. Therefore, after the detection of the alignment marks 1 by the substrate alignment system 350, the temperature adjustment system 60 continuously performs the temperature adjustment for the substrate holder PH which holds the substrate P so that the temperature change and the thermal deformation of the substrate P are not caused by the contact between the liquid LQ and the substrate P. The temperature adjustment system 60 adjusts the temperature of the liquid LQ to be supplied to the temperature-adjusting flow passage 62 and the liquid supply amount per unit time, for example, on the basis of the temperature measurement result for the substrate P obtained by the temperature sensor 80 provided in the upper surface of the substrate holder PH. Thus, the temperature adjustment is effected for the substrate P by the aid of the substrate holder PH.

The control unit CONT measures the temperature of the liquid LQ by using the temperature sensor before starting the exposure for the substrate P. The liquid LQ, which is to be used for the exposure, is made to flow onto the substrate P, and/or the temperature adjustment is performed for the substrate holder PH and/or the optical element 2 depending on the temperature of the liquid LQ. Accordingly, the temperatures of the liquid LQ and the substrate P are in the desired state.

The control unit CONT performs the projection exposure (liquid immersion exposure) with the image of the pattern of the mask M onto the substrate P via the projection optical system PL and the liquid LQ disposed between the projection optical system PL and the substrate P, while moving the substrate stage PST supporting the substrate P in the X axis direction (scanning direction), while recovering the liquid LQ from the surface of the substrate P by the liquid recovery mechanism 20 concurrently with the supply of the liquid LQ onto the substrate P by the liquid supply mechanism 10 (Step SA4).

The liquid LQ, which has been supplied from the liquid supply section 11 of the liquid supply mechanism 10 in order to form the liquid immersion area AR2, flows through the supply tubes 13A, 13B, and then the liquid LQ is supplied onto the substrate P from the liquid supply ports 12A, 12B via the supply flow passages formed in the flow passage-forming member 70. The liquid LQ, which has been supplied onto the substrate P from the liquid supply ports 12A, 12B, is supplied so that the liquid LQ is spread while causing the wetting between the substrate P and the lower end surface of the end portion (optical element 2) of the projection optical system PL. The liquid immersion area AR2, which is smaller than the substrate P and which is larger than the projection area AR1, is locally formed on a part of the substrate P including the projection area AR1. In this situation, the control unit CONT supplies the liquid LQ onto the substrate P simultaneously from the both sides of the projection area AR1 in relation to the scanning direction, through the liquid supply ports 12A, 12B which are included in the liquid supply mechanism 10 and which are arranged on the both sides in the X axis direction (scanning direction) of the projection area AR1 respectively. Accordingly, the liquid immersion area AR2 is formed uniformly and satisfactorily.

In this embodiment, the exposure apparatus EX performs the projection exposure for the substrate P with the image of the pattern of the mask M while moving the mask M and the substrate P in the X axis direction (scanning direction). During the scanning exposure, an image of a pattern of a part of the mask M is projected onto the projection area AR1 via the projection optical system PL and the liquid LQ in the liquid immersion area AR2. The mask M is moved at the velocity V in the −X direction (or in the +X direction), in synchronization with which the substrate P is moved at the velocity β·V (β is the projection magnification) in the +X direction (or in the −X direction) with respect to the projection area AR1. The plurality of shot areas S1 to S24 are set on the substrate P. After the completion of the exposure for one shot area, the next shot area is moved to the scanning start position in accordance with the stepping movement of the substrate P. The scanning exposure process is successively performed thereafter for each of the shot areas S1 to S24 while moving the substrate P in the step-and-scan manner.

When the plurality of shot areas S1 to S24 on the substrate P are successively subjected to the exposure respectively, the XY stage 53 is moved on the basis of the baseline amount and the position information (arrangement information) about the respective shot areas determined in Step SA3. The liquid immersion exposure process is performed for each of the shot areas S1 to S24 while effecting the positional adjustment between the image of the pattern and each of the shot areas S1 to S24 on the substrate P.

The control unit CONT detects the surface position information about the surface of the substrate P by using the focus-detecting system 30 during the exposure for the shot areas S1 to S24. The liquid immersion exposure process is performed while moving the substrate P in the Z axis direction and/or in the direction of inclination by the aid of the substrate stage PST and/or changing the image characteristic of the projection optical system PL so that the surface of the substrate P is adjusted to match the image plane via the projection optical system PL and the liquid LQ. The focus-detecting system 30 detects the surface position information about the surface of the substrate P by emitting the detecting light beam La from the light-emitting section 30A through the liquid LQ onto the substrate P and receiving the reflected light beam from the substrate P through the liquid LQ by the light-receiving section 30B during the exposure for each of the shot areas.

The positional relationship between the surface of the substrate P and the image plane formed through the liquid LQ may be adjusted on the basis of the surface information about the substrate P determined before the supply of the liquid LQ without using the focus-detecting system 30 during the scanning exposure for each of the shot areas S1 to S24. Alternatively, the position of the surface of the substrate P may be controlled in consideration of both of the surface position information of the substrate P determined before the supply of the liquid LQ and the surface position information of the substrate P detected through the liquid LQ during the scanning exposure.

The control unit CONT concurrently performs the liquid immersion exposure process for the substrate P and the temperature adjustment by the temperature adjustment system 60. The temperature adjustment system 60 performs the temperature adjustment for the liquid LQ to be supplied onto the substrate P and the temperature adjustment for the substrate holder PH and the optical element 2 so that the temperature of the liquid LQ of the liquid immersion area AR2 is not changed, the temperature distribution is not generated in the liquid LQ, and the temperature change and the thermal deformation are not caused for the optical element 2 and the substrate P. In this procedure, the temperature adjustment system 60 uses, for example, the temperature sensors 80, 81, 84 to measure the temperatures of the substrate P (substrate holder PH), the liquid LQ to be supplied, and the optical element 2. The temperature adjustment system 60 performs the temperature adjustment for the substrate holder PH and the optical element 2 and the temperature adjustment for the liquid LQ to be supplied onto the substrate P on the basis of the measurement results obtained thereby.

The factors to cause the temperature distribution and the temperature change of the liquid LQ include, for example, the temperature change of the optical element 2 and/or the substrate P which makes contact with the liquid LQ. The factors to cause the temperature change of the substrate P and the optical element 2 include, for example, the absorption of the thermal energy of the radiated exposure light beam EL by the optical element 2 and/or the substrate P (including the resist on the substrate P) and the heat transfer to the substrate P from the substrate stage PST which has the motor and the actuator (substrate stage-driving unit PSTD) as the heat-generating sources. Further, it is also considered that the liquid LQ itself undergoes the temperature change by being irradiated with the exposure light beam EL. When the difference appears among the temperature of the liquid LQ, the temperature of the substrate P which makes contact with the liquid LQ, and the temperature of the optical element 2 due to the factors as described above, the heat exchange (heat transfer) is effected therebetween. There is a possibility such that the temperature change and/or the temperature distribution arises in the liquid LQ with which the space between the substrate P and the optical element 2 is filled, and/or the temperature change and/or the thermal deformation of the substrate P and/or the optical element 2 is caused. In such a situation, there is such a possibility that the inconvenience may arise as follows. That is, the optical path for the exposure light beam EL is varied due to the temperature change as described above. The substrate P is thermally deformed. The optical element 2 is thermally deformed to cause the variation of the image characteristic to be obtained via the projection optical system PL and the liquid LQ. The accuracy is deteriorated for the overlay and the positional adjustment for the image of the pattern. Further, the following possibility may also arise. That is, the refractive index fluctuation and/or the refractive index distribution appears in the liquid LQ due to the temperature change (temperature distribution) of the liquid LQ. For example, the optical path for the detecting light beam La of the focus-detecting system 30 is varied to cause any measurement error in the focus-detecting system 30.

Further, there is such a possibility that the temperature of the liquid LQ supplied from the liquid temperature-adjusting unit 61 may be slightly changed with time. Also in such a situation, the temperature distribution and/or the temperature change is caused in the liquid LQ with which the space between the substrate P and the optical element 2 is filled.

Accordingly, the temperature adjustment system 60 performs the temperature adjustment for the liquid LQ, the optical element 2, and the substrate holder PH (as well as the substrate P) so that approximately the same temperature is ensured for the liquid LQ, the optical element 2, and the substrate P, while no temperature change is caused for the optical element 2, the substrate P, and the liquid LQ due to the contact between the liquid LQ and the substrate P and/or the contact between the liquid LQ and the optical element 2. Thus, it is possible to avoid the inconvenience which would be otherwise caused such that the measurement accuracy and the exposure accuracy are deteriorated.

In particular, the temperature adjustment system 60 performs the temperature adjustment for the substrate holder PH so that the heat transfer is reduced between the substrate P and the liquid LQ on the substrate P. Therefore, it is possible to effectively avoid the inconvenience which would be otherwise caused such that the substrate P is thermally deformed and/or the liquid LQ undergoes the temperature change and/or the temperature distribution due to the thermal energy transferred to the substrate P from the substrate stage PST which has the motor and the actuator as the heat-generating sources.

The temperature adjustment system 60 performs the temperature adjustment for the optical element 2 so that the heat transfer is reduced between the optical element 2 and the liquid LQ which makes contact with the optical element 2. Therefore, it is possible to effectively avoid the inconvenience which would be otherwise caused such that the optical element 2 undergoes the temperature change and/or the thermal deformation and/or the temperature change and/or the temperature distribution arises in the liquid LQ due to the thermal energy transferred to the liquid LQ which makes contact with the optical element 2 from the optical element 2 which generates the heat by absorbing the thermal energy of the exposure light beam EL.

When the temperature distribution appears in the liquid LQ, and the refractive index distribution arises, then there is such a possibility that the focus-detecting system 30, which is constructed to radiate the detecting light beam La in the oblique direction (from the obliquely upward position) with respect to the substrate P, may undergo the considerable deterioration of the measurement accuracy. However, the temperature adjustment system 60 performs the temperature adjustment for the substrate holder PH and/or the temperature adjustment for the optical element 2 so that the temperature distribution is not caused in the liquid LQ. Accordingly, it is possible to avoid the deterioration of the measurement accuracy of the focus-detecting system 30.

Another liquid temperature-adjusting unit, which is distinct from the liquid temperature-adjusting unit 61 to be used for the temperature adjustment for the optical element 2 and the substrate holder PH, may be provided at an intermediate position of each of the supply tubes 13A, 13B when the temperature adjustment is performed for the liquid LQ of the liquid immersion area AR2. The temperature of the liquid LQ to be supplied from the liquid supply ports 12A, 12B may be adjusted, and/or the liquid supply amount per unit time may be adjusted on the basis of the measurement result obtained by the temperature sensor.

After the completion of the liquid immersion exposure for the substrate P, the control unit CONT uses the liquid recovery mechanism 20 or the predetermined liquid recovery mechanism provided distinctly from the liquid recovery mechanism 20 to recover the liquid LQ of the liquid immersion area AR2 formed on the substrate P (Step SA5).

After the liquid LQ is recovered from the surfaces of the substrate P and the substrate stage PST, the control unit CONT exports (unloads) the substrate P having been subjected to the exposure, from the substrate stage PST (Step SA6).

As explained above, the substrate P, which makes contact with the liquid LQ, can be adjusted to have the desired temperature by the aid of the substrate holder PH by performing the temperature adjustment for the substrate holder PH which holds the substrate P, by using the temperature adjustment system 60. For example, the upper plate 401 and the optical element 2 through which the exposure light beam EL passes while making contact with the liquid LQ can be also subjected to the temperature adjustment by using the temperature adjustment system 60. Therefore, the liquid LQ, which makes contact with the substrate P and the optical element 2, can be maintained at the desired temperature as well. Additionally, it is also possible to avoid the temperature change and the thermal deformation of the substrate P and the optical element 2 making contact with the liquid LQ. Therefore, even in the case of the arrangement in which the detecting light beam La is radiated onto the liquid LQ to perform the measurement process on the basis of the detecting light beam La through the liquid LQ, it is possible to maintain the satisfactory measurement accuracy. The exposure light beam EL can be radiated onto the substrate P through the liquid LQ maintained at the desired temperature. Therefore, it is possible to maintain the satisfactory exposure accuracy. Further, the temperature adjustment is performed, for example, for the substrate P (substrate holder PH), the optical element 2, and the reference member 300 which make contact with the liquid LQ. Therefore, it is also possible to avoid the temperature change and the thermal deformation of, for example, the substrate P, the optical element 2, and the reference member 300, which would be otherwise caused by the vaporization of the liquid.

For example, when a part of the liquid immersion area of the liquid LQ formed on the reference member 300 is arranged on the flat surface 51 as shown in FIG. 9, or when the edge area E (FIG. 1) on the substrate P is subjected to the exposure, then a part of the liquid immersion area AR2 of the liquid LQ is arranged on the flat surface 51 in some cases. However, it is possible to avoid the inconvenience of the occurrence of the temperature change (temperature distribution) in the liquid LQ even when the liquid LQ makes contact with the flat surface 51, by effecting the temperature adjustment for the plate member 50 for forming the flat surface 51 around the substrate P as well.

For example, when the temperature adjustment is performed for the substrate P before performing the detection of the alignment mark 1 on the substrate P, or when the temperature adjustment is performed before starting the exposure for the substrate P, then the temperature adjustment can be also performed for the substrate P such that the liquid LQ, which is to be used for the exposure, is made to flow onto the substrate P for a certain period of time. In this procedure, when the liquid supply amount per unit time, which is brought about during the temperature adjustment, is made larger than the liquid supply amount which is brought about during the liquid immersion exposure. Accordingly, it is possible to adjust the substrate P to have the desired temperature more effectively in a short period of time. When the liquid supply amount is increased, it is appropriate to increase the liquid recovery amount in response to the liquid supply amount in order to avoid any outflow of the liquid LQ.

It is preferable that the temperature adjustment is performed so that the difference in temperature of the substrate P (or the liquid LQ or the optical element 2) is decreased as much as possible between the alignment process (Step SA3) and the liquid immersion exposure process (Step SA4) in order to improve the overlay accuracy of the pattern on the substrate P. However, there is such a possibility that the difference in temperature arises, for example, due the light radiation condition and the driving condition of the actuator. In such a situation, for example, the thermal deformation amount of the substrate P (variation amount of the linear expansion), which is caused by the difference in temperature between the alignment process and the liquid immersion exposure process, is previously determined. A correction amount, which is used to correct the variation amount, is determined beforehand. The positional relationship between the substrate P and the image of the pattern may be corrected on the basis of the correction amount when the overlay exposure is performed.

In the embodiment described above, the measurement process is performed after the substrate P is loaded on the substrate stage PST. However, the measurement process may be performed every time when a plurality of substrates are processed, during which only the alignment process may be performed in Step SA3.

The inflow of the liquid LQ into the recess 55 of the Z stage 52 is avoided during each of the measurement processes by loading the substrate P as the exposure objective on the substrate stage PST when the measurement process is performed. However, when the upper surface of the substrate stage PST has a sufficient areal size with respect to the size of the liquid immersion area AR2, and the liquid LQ makes no inflow into the recess 55 of the Z stage 52 when the measurement process is performed, then the substrate P may be loaded on the substrate stage after the measurement process is completed.

In order to avoid the inflow of the liquid LQ into the recess 55 of the Z stage 52 when the measurement process is performed, a dummy substrate, which has the same shape as that of the substrate P, may be loaded on the substrate stage PST in place of the substrate P as the exposure objective, and the dummy substrate may be exchanged with the substrate P as the exposure objective after the measurement process is completed.

In the embodiment described above, the temperature adjustment is performed for the substrate P by using the temperature-adjusting holder 90 before the substrate P is loaded on the substrate stage PST. However, it is also allowable that the temperature-adjusting holder 90 is omitted on condition that the sufficient effect is obtained by making the temperature-adjusted liquid LQ to flow onto the substrate P after loading the substrate P on the substrate stage PST and/or performing the temperature adjustment for the substrate holder PH.

In the embodiment described above, the temperature adjustment is performed, for example, for the optical element 2, the substrate holder PH, and the reference member 300. However, it is not necessarily indispensable that the temperature adjustment is performed for all of them. It is also allowable that the temperature adjustment is performed for only such a member in which any influence is feared to arise due to the heat exchange with the liquid LQ.

In the embodiment described above, the temperature adjustment is performed for the objects such as the optical element 2, the substrate P (substrate holder PH), and the reference member 300 which make contact with the liquid LQ. However, it is enough that only the temperature of the liquid LQ to be supplied is adjusted depending on the temperature of the object or objects, which makes contact with the liquid LQ supplied to the image plane side of the projection optical system PL, without performing the temperature adjustment for the object or objects. In this procedure, it is desirable that the temperature of each of the objects is measured, for example, by using a temperature sensor, and the temperature of the liquid LQ is adjusted on the basis of the measurement result obtained thereby. Also in this case, it is possible to suppress the heat exchange between the liquid LQ and the object which makes contact with the liquid LQ, and it is possible to avoid the temperature change (occurrence of the temperature distribution) of the liquid LQ and the temperature change and the thermal deformation of the object which makes contact with the liquid LQ.

Further, when the heat exchange (heat transfer) is also feared to occur between the liquid LQ and the flow passage-forming member 70, it is also appropriate that the flow passage-forming member 70 is subjected to the temperature adjustment by using the temperature adjustment system 60. In this case, a heater may be embedded in the flow passage-forming member 70, and/or a temperature-adjusting flow passage, which is distinct from the flow passages communicated with the liquid supply mechanism 10 and the liquid recovery mechanism 20, may be provided in the flow passage-forming member 70 to make the temperature-adjusting fluid to flow through the temperature-adjusting flow passage. In this arrangement, a temperature sensor may be arranged for the flow passage-forming member 70 to measure the temperature of the flow passage-forming member 70. The temperature of the flow passage-forming member 70 may be adjusted on the basis of the obtained result.

Further, in the embodiment described above, the temperature-adjusting flow passage 62 is formed in the substrate holder PH in order to perform the temperature adjustment for the substrate P, and the temperature adjustment is performed for the substrate holder PH by making the temperature-adjusted liquid LQ to flow through the temperature-adjusting flow passage 62. However, a temperature-adjusting mechanism for the motor and/or the actuator provided in the substrate stage PST may be also used for the temperature adjustment for the substrate holder PH.

Another embodiment of the present invention will be explained below. In the following description, the constitutive parts or components, which are the same as or equivalent to those of the embodiment described above, are designated by the same reference numerals, any explanation of which will be simplified or omitted.

Figure 10:
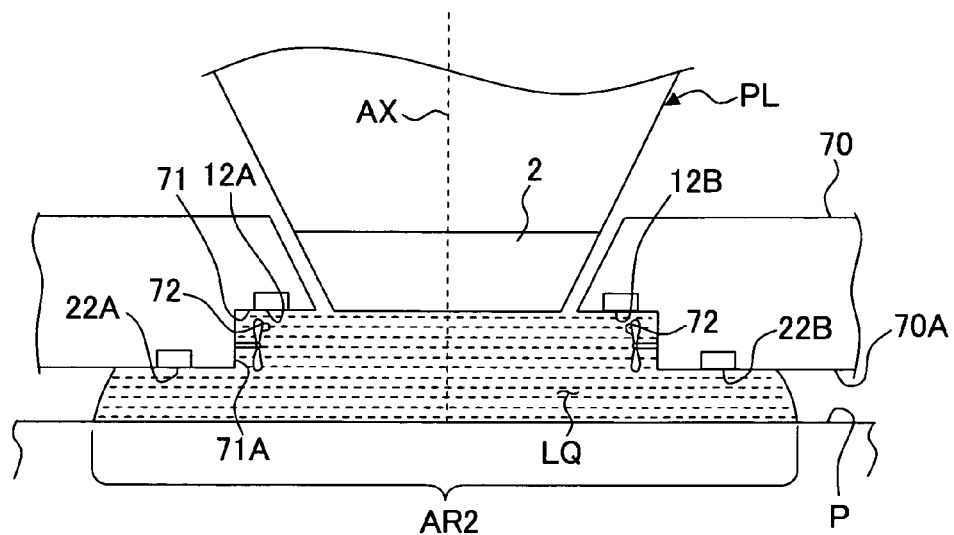
FIG. 10 shows another embodiment of a temperature adjustment system according to the present invention.

With reference to FIG. 10, a stepped portion 71 is formed on the lower surface 70A of the flow passage-forming member 70 so that the areas, in which the liquid supply ports 12A, 12B are provided, are disposed far or away from the substrate P as compared with the areas in which the liquid recovery ports 22A, 22B are provided. Agitator units 72, which agitate the liquid LQ in the liquid immersion area AR2, are provided on the surface 71A of the stepped portion 71, the surface 71A being directed toward the optical axis AX of the projection optical system PL. The agitator units 72 are provided in the vicinity of the liquid supply ports 12A, 12B respectively to agitate the liquid LQ supplied onto the substrate P via the liquid supply ports 12A, 12B. The agitator units 72 are capable of agitating the liquid LQ during, before, and/or after the liquid immersion exposure for the substrate P and/or during, before, and/or after the measurement in the state in which the liquid LQ is arranged on the reference member 300 or the upper plates 401, 501. The liquid LQ is agitated with the agitator units 72, and thus it is possible to avoid the inconvenience of the occurrence of the temperature distribution in the liquid LQ.

Figure 11:
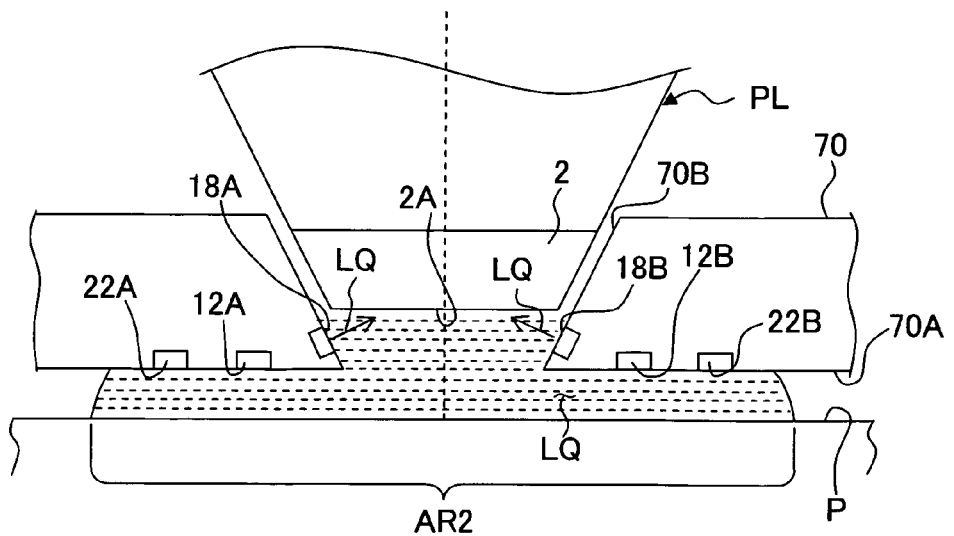
FIG. 11 shows still another embodiment of a temperature adjustment system according to the present invention.

As shown in FIG. 11, it is also appropriate that second liquid supply ports 18A, 18B, which blows the jets of the liquid LQ against the optical element 2, are provided, for example, on the inner side surface 70B of the flow passage-forming member 70. That is, the second liquid supply ports 18A, 18B can be formed so that the second liquid supply ports 18A, 18B are directed toward the liquid contact surface 2A of the optical element 2 as well. When the liquid LQ is supplied from the second liquid supply ports 18A, 18B so that the liquid LQ is blown against the optical element 2, then it is possible to suppress the temperature change (increase in the temperature) of the optical element 2, which would be otherwise caused by the exposure light beam EL, and it is possible to avoid the inconvenience of the occurrence of the temperature distribution in the liquid LQ, by maintaining the optical element 2 at the desired temperature.

In place of the arrangement in which the liquid LQ is allowed to flow so that the liquid LQ is blown against the optical element 2, it is also allowable that the liquid LQ, which is supplied from the second liquid supply ports 18A, 18B, flows while forming laminar flows along the liquid contact surface 2A of the optical element 2. In this case, it is appropriate that the second liquid supply ports 18A, 18B are formed in the vicinity of the liquid contact surface 2A while being directed in the directions perpendicular to the optical axis of the optical element 2. Accordingly, it is possible to suppress the influence (for example, any friction and/or any dissolution) exerted on the optical element 2.

Figure 12:
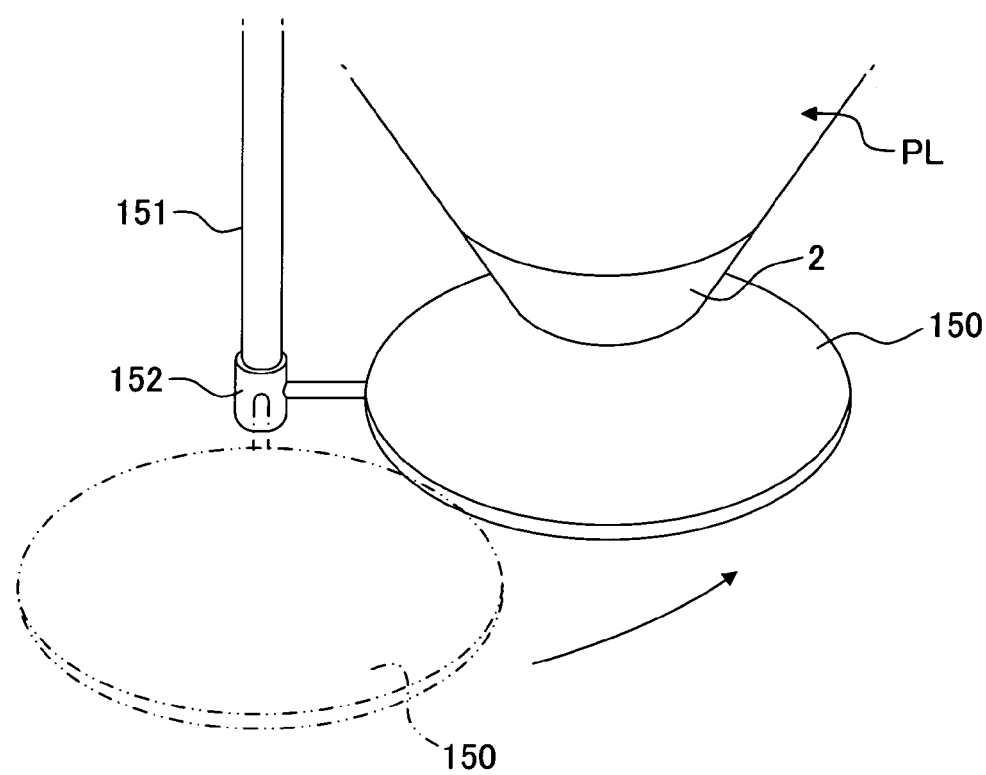
FIG. 12 shows still another embodiment of a temperature adjustment system according to the present invention.

In the embodiment described above, when the temperature adjustment is performed for the optical element 2 by supplying the liquid LQ for the exposure to the image plane side of the projection optical system PL, the liquid LQ is supplied in the state in which the optical element 2 is opposed to the substrate P or the predetermined flat surface on the substrate stage PST. However, as shown in FIG. 12, a plate member 150, which is provided movably toward and away with respect to the area disposed under or below the projection optical system PL, may be provided. When the plate member 150 is arranged in the area disposed below the projection optical system PL, the plate member 150 can be opposed to the optical element 2 of the projection optical system PL at a predetermined distance with respect to the optical member 2. A rotating mechanism 152, which is rotated about the center of rotation of a shaft section 151, is provided for the plate member 150. The plate member 150 is movable toward and away with respect to the area disposed below the projection optical system PL in accordance with the driving of the rotating mechanism 152. The upper end of the shaft section 151 can be attached to a predetermined member including, for example, a column (body) or a surface plate for holding the barrel PK of the projection optical system PL. The rotating mechanism 152 also has a function as a Z-driving mechanism for moving the plate member 150 in the Z axis direction. It is possible to adjust the distance between the plate member 150 and the optical element 2 of the projection optical system PL. When the plate member 150 is provided as described above, the temperature adjustment can be performed for the optical element 2 by using the liquid LQ by supplying the liquid LQ from the liquid supply ports 12 in a state in which the optical element 2 is opposed to the plate member 150, for example, even when the substrate stage PST is not arranged in the area disposed below the projection optical system PL in order to load or unload the substrate P. Additionally, it is also possible to always wet the liquid contact surface 2A of the projection optical system PL. Therefore, it is also possible to avoid the adhesion of any foreign matter or the like to the liquid contact surface 2A, which would be otherwise caused by the drying of the liquid contact surface 2A of the projection optical system PL. Further, even when the substrate stage PST is not positioned below the projection optical system PL, the plate member 150 can be used to prevent the liquid from falling onto any inconvenient place from the projection optical system PL (optical element 2) and/or the flow passage-forming member 70.

The liquid temperature-adjusting unit 61 is capable of precisely adjusting the temperature of the liquid LQ. However, as depicted in a graph schematically shown in FIG. 13(a), there is such a possibility that the temperature of the liquid LQ supplied from the liquid temperature-adjusting unit 61 may be slightly changed with time. In the graph shown in FIG. 13(a), the horizontal axis represents the time t, and the vertical axis represents the temperature (temperature variation amount) $\Delta T$. When the liquid LQ, which undergoes the temperature change with time as described above, is continuously supplied onto the substrate P, any temperature distribution appears in the liquid LQ of the liquid immersion area AR2 formed on the substrate P.

In view of the above, as shown in FIG. 14, an attenuating member 100, which attenuates the temperature variation of the liquid LQ allowed to pass therethrough, is provided in the supply passage 13 between the liquid supply port 12 and the liquid temperature-adjusting unit 61. Accordingly, it is possible to attenuate the temperature change with time of the liquid LQ supplied via the liquid supply port 12 as depicted in a graph schematically shown in FIG. 13(b). The attenuating member 100 is thermally insulated from the surroundings by a heat insulating material. Those usable as the attenuating member 100 include, for example, porous members represented by meshes made of metals and sintered members made of metals. Alternatively, it is also possible to use inline filters formed of, for example, hollow fibers. In the case of the porous member or the like, the contact area with respect to the liquid LQ passing therethrough is large, and the thermal capacity with respect to the liquid LQ is large as well. Therefore, it is possible to sufficiently attenuate the temperature variation of the liquid LQ passing therethrough. When the metal is used for the attenuating member 100, it is preferable that the metal is stainless steel.

The present invention is also applicable to a twin-stage type exposure apparatus. The structure and the exposure operation of the twin-stage type exposure apparatus are disclosed, for example, in Japanese Patent Application Laid-open Nos. 10-163099 and 10-214783 (corresponding to U.S. Pat. Nos. 6,341,007, 6,400,441, 6,549,269, and 6,590,634), Published Japanese Translation of PCT International Publication for Patent Application No. 2000-505958 (corresponding to U.S. Pat. No. 5,969,441), and U.S. Pat. No. 6,208,407, contents of which are incorporated herein by reference within a range of permission of the domestic laws and ordinances of the state designated or selected in this international application.

Figure 15:
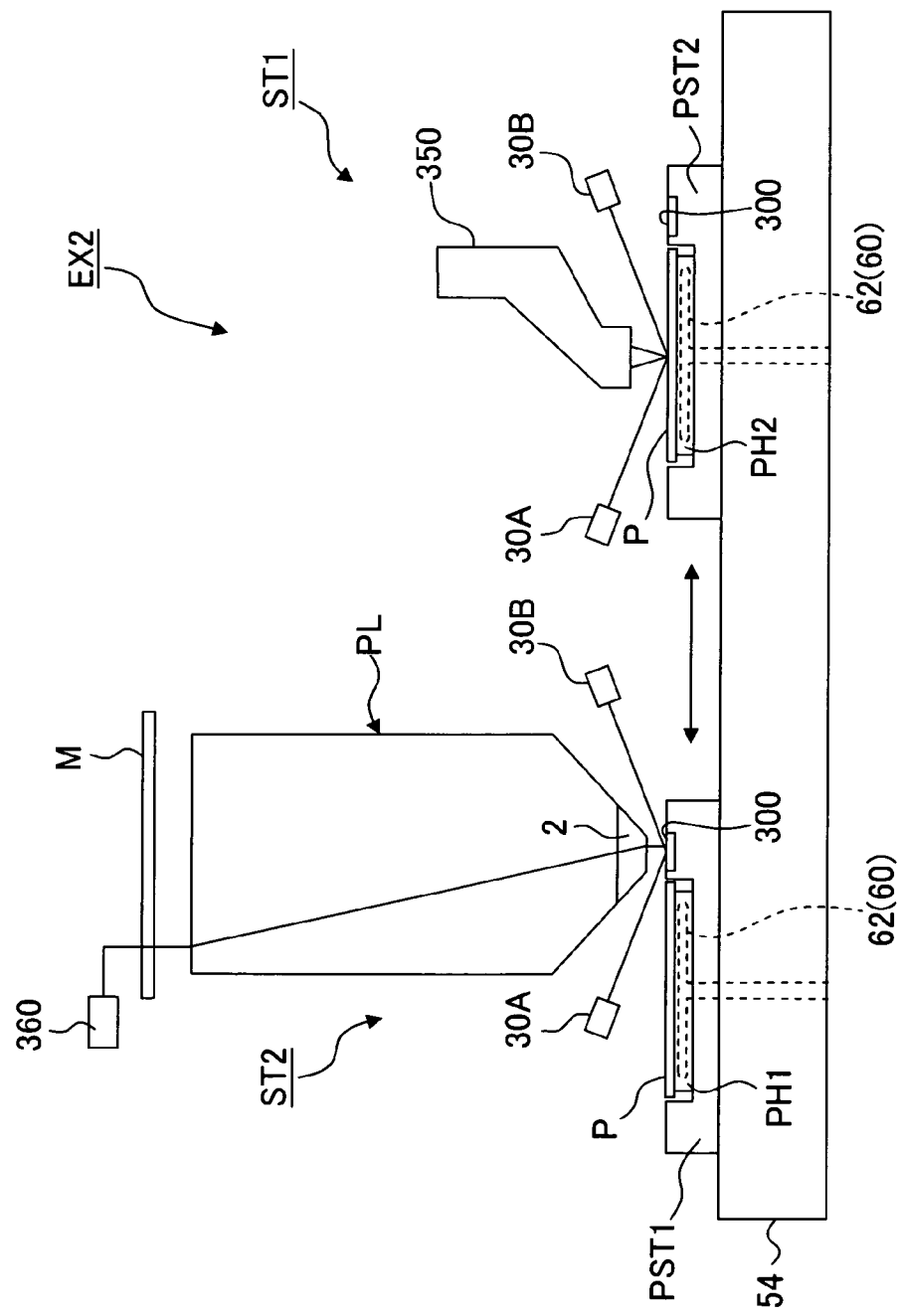
FIG. 15 shows a schematic arrangement illustrating an embodiment of an exposure apparatus of the present invention.

FIG. 15 shows a schematic arrangement illustrating an example of a twin-stage type exposure apparatus. The twin-stage type exposure apparatus EX2 shown in FIG. 15 includes a first substrate stage PST1 which has a substrate holder PH1 for holding the substrate P and which is movable while holding the substrate P on the substrate holder PH1, and a second substrate stage PST2 which has a substrate holder PH2 for holding the substrate P and which is movable while holding the substrate P on the substrate holder PH2. The first and second substrate stages PST1, PST2 are movable independently on a common base 54 respectively. Each of the first and second substrate stages PST1, PST2 is provided with the sensors such as the reference member 300, the uneven illuminance sensor 400, and the spatial image-measuring sensor 500 in the same manner as in the embodiment described above.

The twin-stage type exposure apparatus EX2 further includes a measuring station ST1 for performing the measurement for the substrate P held on one substrate stage PST1 (PST2), and an exposure station ST2 provided with the projection optical system PL for performing the exposure for the substrate P held on the other substrate stage PST2 (PST1). All of the components of the system shown in FIG. 1 (including the focus-detecting system 30) except for the substrate alignment system 350 are provided in the exposure station ST2. The substrate alignment system 350 and the focus-detecting system 30 having the light-emitting section 30A and the light-receiving section 30B are provided in the measuring station ST1.

The temperature adjustment system 60, which performs the temperature adjustment for the substrate holder PH1, PH2 in the measuring station ST1, is provided for each of the first substrate stage PST1 and the second substrate stage PST2.

The basic operation of the twin-stage type exposure apparatus as described above is as follows. That is, for example, the exposure process is performed for the substrate P on the second substrate stage PST2 in the exposure station ST2, during which the exchange process and the measurement process are performed for the substrate P on the first substrate stage PST1 in the measuring station ST1. When the respective operations are completed, the second substrate stage PST2 is moved to the measuring station ST1, concurrently with which the first substrate stage PST1 is moved to the exposure station ST2. In this situation, the measurement process and the exchange process are performed on the second substrate stage PST2, and the exposure process is performed for the substrate P on the first substrate stage PST1.

In this embodiment, the measurement of the substrate P, which is performed in the measuring station ST1, includes the measurement of the surface position information about the surface of the substrate P performed by the focus-detecting system 30, and the detection of the alignment marks 1 on the substrate P and the reference mark PFM on the reference member 300 performed by the substrate alignment system 350. For example, the liquid immersion exposure process is performed in the exposure station ST2 for the substrate P on the second substrate stage PST2, during which the measurement process is performed by using the substrate alignment system 350, the focus-detecting system 30, and the reference member 300 in the measuring station ST1 for the substrate P on the first substrate stage PST1. When the measurement process is completed, the exchange operation is performed for the first substrate stage PST1 and the second substrate stage PST2. The first substrate stage PST1 is positioned so that the reference member 300 of the first substrate stage PST1 is opposed to the projection optical system PL as shown in FIG. 15. In this state, the control unit CONT starts the supply of the liquid LQ. The space between the projection optical system PL and the reference member 300 is filled with the liquid LQ to perform the exposure process and the measurement process for the reference mark MFM of the reference member 300 by the mask alignment system 360 through the liquid LQ. The alignment information about the respective shot areas S1 to S24, which has been once determined in the measuring station ST1, is set (stored) on the basis of the reference mark PFM of the reference member 300. When the liquid immersion exposure is executed in the exposure station ST2, the movement of the first substrate stage PST1 is controlled so that the respective shot areas S1 to S24 are positioned on the basis of the positional relationship between the mask M and the reference mark MFM formed in the predetermined positional relationship with respect to the reference mark PFM of the reference member 300. That is, the alignment information (arrangement information) about the respective shot areas S1 to S24 determined in the measuring station ST1 is effectively transmitted to the exposure station ST2 by using the reference marks PFM, MFM.

As described above, in the case of the twin-stage type exposure apparatus, the liquid immersion exposure process can be performed on one stage, during which the measurement process can be performed not through the liquid on the other stage. Therefore, it is possible to improve the throughput of the exposure process.

The temperature adjustment system 60 adjusts the substrate P so that the substrate P has the predetermined temperature by performing the temperature adjustment for the substrate holder PH before executing the measurement for the substrate P in the measuring station ST1. After the substrate P is adjusted to have the predetermined temperature by the aid of the substrate holder PH, the measurement process is performed for the substrate P. The temperature adjustment system 60 continues the temperature adjustment for the substrate P by the aid of the substrate holder PH during the measurement process for the substrate P as well.

When the temperature adjustment is performed for the substrate holder PH1 in the measuring station ST1, the temperature adjustment system 60 adjusts the temperature of the substrate holder PH1 depending on the temperature of the liquid LQ supplied from the liquid supply mechanism 10 provided for the exposure station ST2. Specifically, the temperature adjustment system 60 adjusts the temperature of the substrate holder PH1 in the measuring station ST1 so that the temperature of the substrate P is approximately the same as the temperature of the liquid LQ supplied from the liquid supply mechanism 10. After the measurement process for the substrate P is completed in the measuring station ST1, the control unit CONT moves the first substrate stage PST1 from the measuring station ST1 to the exposure station ST2.

In the exposure station ST2, the exposure process is performed for the substrate P supported on the second substrate stage PST2. After the exposure process for the substrate P on the second substrate stage PST2 is completed in the exposure station ST2, the control unit CONT moves, to the exposure station ST2, the first substrate stage PST1 which supports the substrate P for which the measurement process has been completed in the measuring station ST1. In this situation, when the exposure process is continued for the substrate P on the second substrate stage PST2 in the exposure station ST2 after the measurement process is completed for the substrate P on the first substrate stage PST1, the control unit CONT continues the temperature adjustment by the temperature adjustment system 60 for the substrate P on the first substrate stage PST1 in the measuring station ST1 until the exposure is completed for the substrate P in the exposure station ST2. In other words, after the control unit CONT started the temperature adjustment is started for the substrate P on the first substrate stage PST1 in the measuring station ST1, the control unit CONT continues the temperature adjustment in the measuring station ST1 until the exposure process is completed for the substrate P on the second substrate stage PST2 in the exposure station ST2.

The control unit CONT supplies the liquid LQ onto the substrate P on the first substrate stage PST1 from the liquid supply mechanism 10 in order to perform the liquid immersion exposure for the substrate P, the first substrate stage PST1 having been moved to the exposure station ST2 after the completion of the measurement process. In this situation, the substrate P, which is held on the first substrate stage PST1, is adjusted to have approximately the same temperature as that of the liquid LQ by the temperature adjustment system 60 in the measuring station ST2. Therefore, even when the liquid LQ is supplied onto the substrate P, the temperature change and the thermal deformation of the substrate P are not caused. It goes without saying that the temperature adjustment for the substrate holder PH1 is appropriately continued by the temperature adjustment system 60 in the exposure station ST2 as well in order to suppress the temperature change of the substrate P caused by the contact with the supplied liquid LQ. The control unit CONT exposes the substrate P by radiating the exposure light beam EL onto the substrate P through the liquid LQ in the exposure station ST2. The control unit CONT exposes the substrate P while performing the temperature adjustment for the substrate holder PH and the optical element 2 by the temperature adjustment system 60 during the exposure for the substrate P as well. When it is difficult to continue the temperature adjustment for the substrate holder PH1 after the measurement performed in the measuring station ST1, the temperature adjustment may be performed for the substrate P on the substrate holder PH1, for example, by supplying the liquid LQ for the exposure onto the substrate P from the liquid supply ports 12 before starting the exposure for the substrate P on the substrate holder PH1, and the exposure may be started after the temperature of the substrate P is approximately the same as that of the liquid LQ.

As explained above, in the twin-stage type exposure apparatus provided with the first substrate stage PST1 and the second substrate stage PST1, the substrate holder PH1 for holding the substrate P is subjected to the temperature adjustment by using the temperature adjustment system 60 in the measuring station ST1 for performing the measurement process in relation to the substrate P. Accordingly, the substrate P, which is held by the substrate holder PH, can be adjusted to have the desired temperature. Therefore, the temperature change is prevented from occurring in the substrate P and the thermal deformation after the measurement process performed in the measuring station ST1. The substrate P can be exposed accurately in the exposure station ST2 on the basis of the information measured in the measuring station ST1 (for example, the surface information about the substrate P and the position information about the shot areas on the substrate P).

As described above, pure water is used as the liquid LQ in the embodiments of the present invention. Pure water is advantageous in that pure water is available in a large amount with ease, for example, in the semiconductor production factory, and pure water exerts no harmful influence, for example, on the optical element (lens) and the photoresist on the substrate P. Further, pure water exerts no harmful influence on the environment, and the content of impurity is extremely low. Therefore, it is also expected to obtain the function to wash the surface of the substrate P and the surface of the optical element provided at the end surface of the projection optical system PL. When the purity of pure water supplied from the factory or the like is low, it is also allowable that the exposure apparatus is provided with an ultra pure water-producing unit.

It is approved that the refractive index n of pure water (water) with respect to the exposure light beam EL having a wavelength of about 193 nm is approximately 1.44. When the ArF excimer laser beam (wavelength: 193 nm) is used as the light source of the exposure light beam EL, then the wavelength is shortened on the substrate P by 1/n, i.e., to about 134 nm, and a high resolution is obtained. Further, the depth of focus is magnified about n times, i.e., about 1.44 times as compared with the value obtained in the air. Therefore, when it is enough to secure an approximately equivalent depth of focus as compared with the case of the use in the air, it is possible to further increase the numerical aperture of the projection optical system PL. Also in this viewpoint, the resolution is improved.

When the liquid immersion method is used as described above, the numerical aperture NA of the projection optical system is 0.9 to 1.3 in some cases. When the numerical aperture NA of the projection optical system is large as described above, it is desirable to use the polarized illumination, because, with the random polarized light which has been hitherto used as the exposure light beam the image formation performance is deteriorated due to the polarization effect in some cases. In this case, it is appropriate that the linear polarized illumination, which is adjusted to the longitudinal direction of the line pattern of the line-and-space pattern of the mask (reticle), is effected so that the diffracted light of the S-polarized light component (TE-polarized light component), i.e., the component in the polarization direction along with the longitudinal direction of the line pattern is dominantly allowed to outgo from the pattern of the mask (reticle). When the space between the projection optical system PL and the resist coated on the surface of the substrate P is filled with the liquid, the diffracted light of the S-polarized light component (TE-polarized light component), which contributes to the improvement in the contrast, has the high transmittance on the resist surface, as compared with the case in which the space between the projection optical system PL and the resist coated on the surface of the substrate P is filled with the air (gas). Therefore, it is possible to obtain the high image formation performance even when the numerical aperture NA of the projection optical system exceeds 1.0. Further, it is more effective to appropriately combine, for example, the phase shift mask and the oblique incidence illumination method (especially the dipole illumination method) adjusted to the longitudinal direction of the line pattern as disclosed in Japanese Patent Application Laid-open No. 6-188169.

For example, when the ArF excimer laser is used as the exposure light beam, and the substrate P is exposed with a fine line-and-space pattern (for example, line-and-space of about 25 to 50 nm) by using the projection optical system PL having a reduction magnification of about ¼, then the mask M acts as a polarizing plate due to the Wave guide effect depending on the structure of the mask M (for example, the pattern fineness and the thickness of chromium), and the diffracted light of the S-polarized light component (TE-polarized light component) outgoes from the mask M in an amount larger than that of the diffracted light of the P-polarized light component (TM-polarized light component) which lowers the contrast. Therefore, in this case, it is desirable to use the linear polarized illumination as described above. However, even when the mask M is illuminated with the random polarized light, it is possible to obtain the high resolution performance even when the numerical aperture NA of the projection optical system PL is large, for example, 0.9 to 1.3. When the substrate P is exposed with an extremely fine line-and-space pattern on the mask M, there is such a possibility that the P-polarized light component (TM-polarized light component) is larger than the S-polarized light component (TE-polarized light component) due to the Wire Grid effect. However, for example, when the ArF excimer laser is used as the exposure light beam, and the substrate P is exposed with a line-and-space pattern larger than 25 nm by using the projection optical system PL having a reduction magnification of about ¼, then the diffracted light of the S-polarized light component (TE-polarized light component) outgoes from the mask M in an amount larger than that of the diffracted light of the P-polarized light component (TM-polarized light component). Therefore, it is possible to obtain the high resolution performance even when the numerical aperture NA of the projection optical system PL is large, for example, 0.9 to 1.3.

Further, it is also effective to use the combination of the oblique incidence illumination method and the polarized illumination method in which the linear polarization is effected in the tangential (circumferential) direction of the circle having the center of the optical axis as disclosed in Japanese Patent Application Laid-open No. 6-53120, without being limited only to the linear polarized illumination (S-polarized illumination) adjusted to the longitudinal direction of the line pattern of the mask (reticle). In particular, when the pattern of the mask (reticle) includes not only the line pattern extending in one predetermined direction, but the pattern also includes the line patterns extending in a plurality of different directions in a mixed manner, then it is possible to obtain the high image formation performance even when the numerical aperture NA of the projection optical system is large, by using, in combination, the zonal illumination method and the polarized illumination method in which the light is linearly polarized in the tangential direction of the circle having the center of the optical axis, as disclosed in Japanese Patent Application Laid-open No. 6-53120 as well.

In the embodiment described above, the temperatures of the objects such as the substrate holder PH, the optical element 2 disposed at the end portion of the projection optical system PL, and the reference member 300 which make contact with the liquid LQ are adjusted by making the temperature-adjusted liquid to flow through the flow passages provided in or around the objects. However, it is also allowable that a temperature-controlled gas is made to flow through the flow passages as described above in place of the liquid.

In the embodiments of the present invention, the optical element 2 is attached to the end portion of the projection optical system PL. Such a lens makes it possible to adjust the optical characteristics of the projection optical system PL, for example, the aberration (spherical aberration and coma aberration or the like). The optical element, which is attached to the end portion of the projection optical system PL, may be an optical plate which is usable to adjust the optical characteristics of the projection optical system PL. Alternatively, the optical element may be a plane parallel plate or parallel flat plate through which the exposure light beam EL is transmissive. When the optical element, which makes contact with the liquid LQ, is the plane parallel plate which is cheaper than the lens, it is enough that the plane parallel plate is merely exchanged immediately before supplying the liquid LQ even when any substance (for example, any silicon-based organic matter), which deteriorates the transmittance of the projection optical system PL, the illuminance of the exposure light beam EL on the substrate P, and the uniformity of the illuminance distribution, is adhered to the plane parallel plate, for example, during the transport, the assembling, and/or the adjustment of the exposure apparatus EX. An advantage is obtained such that the exchange cost is lowered as compared with the case in which the optical element which makes contact with the liquid LQ is the lens. That is, the surface of the optical element which makes contact with the liquid LQ is dirtied, for example, due to the adhesion of scattered particles generated from the resist by being irradiated with the exposure light beam EL or any impurity in the liquid LQ. Therefore, it is necessary to periodically exchange the optical element. However, when the optical element is the cheap plane parallel plate, then the cost of the exchange part is low as compared with the lens, and it is possible to shorten the time required for the exchange. Thus, it is possible to suppress the increase in the maintenance cost (running cost) and the decrease in the throughput.

When the pressure, which is generated by the flow of the liquid LQ, is large between the substrate P and the optical element disposed at the end portion of the projection optical system PL, it is also allowable that the optical element is tightly fixed so that the optical element is not moved by the pressure, rather than making the optical element to be exchangeable.

In the embodiments of the present invention, the space between the projection optical system PL and the surface of the substrate P is filled with the liquid LQ. However, for example, it is also allowable to adopt an arrangement in which the space is filled with the liquid LQ in such a state that a cover glass formed of a parallel flat plate is attached to the surface of the substrate P.

The exposure apparatus, to which the liquid immersion method is applied as described above, is constructed such that the substrate P is exposed while filling the optical path space on the outgoing side of the terminal end optical element 2 of the projection optical system PL with the liquid (pure water). However, the optical path space, which is on the incoming side of the terminal end optical element 2 of the projection optical system PL, may be also filled with the liquid (pure water) as disclosed in International Publication No. 2004/019128. In this arrangement, it is also appropriate to adjust the pressure of the liquid in the optical path space on the incoming side of the terminal end optical element 2 of the projection optical system PL. The optical path space can be filled with the liquid quickly and satisfactorily by starting the supply of the liquid while evacuating the gas contained in the optical path space disposed on the incoming side of the terminal end optical element 2 of the projection optical system PL.

The liquid LQ is water in the embodiments of the present invention. However, the liquid LQ may be any liquid other than water. For example, when the light source of the exposure light beam EL is the $F_2$ laser, the $F_2$ laser beam is not transmitted through water. Therefore, liquids preferably usable as the liquid LQ may include, for example, fluorine-based fluids such as fluorine-based oil and perfluoropolyether (PFPE) through which the $F_2$ laser beam is transmissive. In this case, the portion, which makes contact with the liquid LQ, is subjected to a liquid-attracting treatment by forming, for example, a thin film with a substance having a molecular structure containing fluorine having small polarity. Alternatively, other than the above, it is also possible to use, as the liquid LQ, liquids (for example, cedar oil) which have the transmittance with respect to the exposure light beam EL, which have the refractive index as high as possible, and which are stable against the photoresist coated on the surface of the substrate P and the projection optical system PL. Also in this case, the surface treatment is performed depending on the polarity of the liquid LQ to be used. It is also possible to use various fluids having desired refractive indexes including, for example, supercritical fluids and gases having high refractive indexes, in place of pure water as the liquid LQ.

The substrate P, which is usable in the respective embodiments described above, is not limited to the semiconductor wafer for producing the semiconductor device. The applicable substrates include, for example, the glass substrate for the display device, the ceramic wafer for the thin film magnetic head, and the master plate (synthetic silica glass, silicon wafer) for the mask or the reticle to be used for the exposure apparatus.

As for the exposure apparatus EX, the present invention is also applicable to the scanning type exposure apparatus (scanning stepper) based on the step-and-scan system for performing the scanning exposure with the pattern of the mask M by synchronously moving the mask M and the substrate P as well as the projection exposure apparatus (stepper) based on the step-and-repeat system for performing the full field exposure with the pattern of the mask M in a state in which the mask M and the substrate P are allowed to stand still, while successively step-moving the substrate P. The present invention is also applicable to the exposure apparatus based on the step-and-stitch system in which at least two patterns are partially overlaid and transferred on the substrate P. The present invention is also applicable to the full field exposure apparatus based on the stitch system in which the full field exposure is performed on the substrate P by using a projection optical system (for example, the dioptric type projection optical system having a reduction magnification of ⅛ and including no catoptric element) with a reduction image of a first pattern in a state in which the first pattern and the substrate P are allowed to substantially stand still, and then the full field exposure is performed on the substrate P by partially overlaying a reduction image of a second pattern with respect to the first pattern by using the projection optical system in a state in which the second pattern and the substrate P are allowed to substantially stand still.

The present invention is also applicable to the exposure apparatus including a measuring stage which is provided with a measuring member and a sensor separately from the stage for holding the substrate P. In this arrangement, the member on the measuring stage may be subjected to the temperature adjustment, for example, in the same manner as the plate member 50, the reference member 300, and the spatial image sensor 500 on the substrate stage PST as described above, when the projection optical system and the measuring stage are opposed to one another and the liquid immersion area AR2 is formed on the measuring stage. The exposure apparatus provided with the measuring stage is described, for example, in European Patent Publication No. 1,041,357, contents of which are incorporated herein by reference within a range of permission of the domestic laws and ordinances of the state designated or selected in this international application.

In the embodiment described above, the exposure apparatus, in which the space between the projection optical system PL and the substrate P is locally filled with the liquid, is adopted. However, the present invention is also applicable to the liquid immersion exposure apparatus in which the entire surface of the substrate as the exposure objective is covered with the liquid. The structure and the exposure operation of the liquid immersion exposure apparatus in which the entire surface of the substrate as the exposure objective is covered with the liquid are described in detail, for example, in Japanese Patent Application Laid-open Nos. 6-124873 and 10-303114 and U.S. Pat. No. 5,825,043, contents of which are incorporated herein by reference within a range of permission of the domestic laws and ordinances of the state designated or selected in this international application.

It is also possible to use the projection optical systems of the various types as described above as the projection optical system provided in the exposure apparatus. However, the present invention is also applicable to the exposure apparatus of the type having no projection optical system, for example, the proximity type exposure apparatus.

In the embodiment described above, the focus/leveling detecting system, which detects the surface position information of the surface of the substrate P through the liquid LQ, is adopted. However, it is also allowable to adopt the focus/leveling detecting system which detects the surface position information of the surface of the substrate P before the exposure or during the exposure not through the liquid.

In the specified embodiment described above, the optical element 2 at the end portion of the projection optical system PL is arranged in the opening 70C (light-transmitting portion) of the flow passage-forming member 70 while allowing the predetermined spacing distance intervening between the optical element 2 and the flow passage-forming member 70. However, an arbitrary optical element may be installed to the opening 70C of the flow passage-forming member 70. That is, the optical element 2 and/or the optical plate as described above may be held by the flow passage-forming member 70. Also in this case, it is desirable that the projection optical system PL and the flow passage-forming member 70 have the distinct support structures from each other in view of the prevention of the transmission of the vibration.

As for the type of the exposure apparatus EX, the present invention is not limited to the exposure apparatus for the semiconductor device production for exposing the substrate P with the semiconductor device pattern. The present invention is also widely applicable, for example, to the exposure apparatus for producing the liquid crystal display device or for producing the display as well as the exposure apparatus for producing, for example, the thin film magnetic head, the image pickup device (CCD), the reticle, or the mask.

When the linear motor is used for the substrate stage PST and/or the mask stage MST, it is allowable to use any one of linear motors of the air floating type using the air bearing and of the magnetic floating type using the Lorentz's force or the reactance force. Each of the stages PST, MST may be either of the type in which the movement is effected along the guide or of the guideless type in which no guide is provided. An example of the use of the linear motor for the stage is disclosed in U.S. Pat. Nos. 5,623,853 and 5,528,118, contents of which are incorporated herein by reference respectively within a range of permission of the domestic laws and ordinances of the state designated or selected in this international application.

As for the driving mechanism for each of the stages PST, MST, it is also allowable to use a plane motor in which a magnet unit provided with two-dimensionally arranged magnets and an armature unit provided with two-dimensionally arranged coils are opposed to each other, and each of the stages PST, MST is driven by the electromagnetic force. In this arrangement, any one of the magnet unit and the armature unit is connected to the stage PST, MST, and the other of the magnet unit and the armature unit is provided on the side of the movable surface of the stage PST, MST.

The reaction force, which is generated in accordance with the movement of the substrate stage PST, may be mechanically released to the floor (ground) by using a frame member so that the reaction force is not transmitted to the projection optical system PL. The method for handling the reaction force is disclosed in detail, for example, in U.S. Pat. No. 5,528,118 (Japanese Patent Application Laid-open No. 8-166475), contents of which are incorporated herein by reference within a range of permission of the domestic laws and ordinances of the state designated or selected in this international application.

The reaction force, which is generated in accordance with the movement of the mask stage MST, may be mechanically released to the floor (ground) by using a frame member so that the reaction force is not transmitted to the projection optical system PL. The method for handling the reaction force is disclosed in detail, for example, in U.S. Pat. No. 5,874,820 (Japanese Patent Application Laid-open No. 8-330224), contents of which are incorporated herein by reference within a range of permission of the domestic laws and ordinances of the state designated or selected in this international application.

As described above, the exposure apparatus EX according to the embodiment of the present invention is produced by assembling the various subsystems including the respective constitutive elements as defined in claims so that the predetermined mechanical accuracy, the electric accuracy, and the optical accuracy are maintained. In order to secure the various accuracies, adjustments performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the cleanness are managed.

Figure 16:
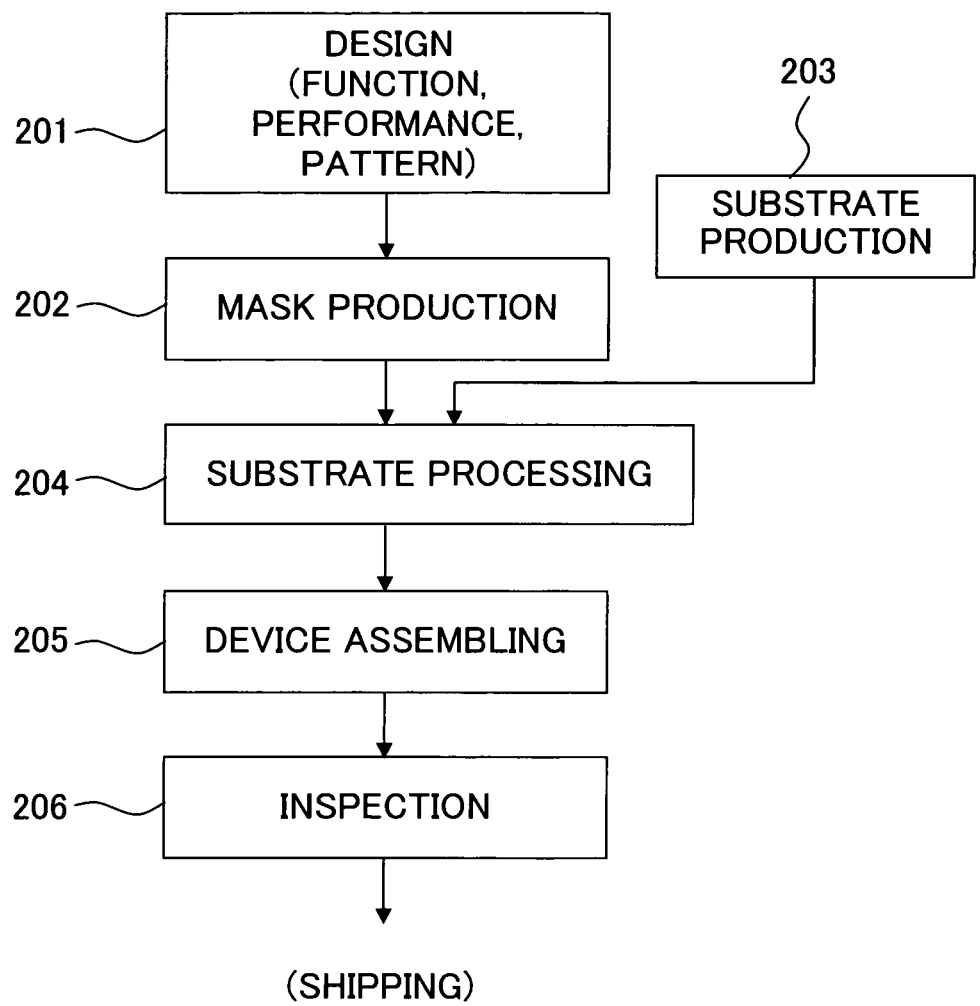
FIG. 16 shows a flow chart illustrating exemplary steps of producing a semiconductor device.

As shown in FIG. 16, the microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, an exposure process step 204 of exposing the substrate with a pattern of the mask by using the exposure apparatus EX of the embodiment described above, a step 205 of assembling the device (including a dicing step, a bonding step, and a packaging step), and an inspection step 206.

INDUSTRIAL APPLICABILITY

According to the present invention, the temperature of the liquid and the temperature of the object which makes contact with the liquid can be maintained to be in the desired state. Therefore, the measurement accuracy obtained when the exposure light beam is radiated through the liquid and the measurement accuracy obtained when the detecting light beam is radiated through the liquid can be maintained to be in the satisfactory state. Therefore, it is possible to produce the device having the desired performance.

The invention claimed is:

1. An exposure apparatus which exposes a substrate by radiating an exposure light beam onto the substrate through a liquid, the exposure apparatus comprising:
   a flow-passage forming member having a supply inlet from which the liquid is supplied, the flow-passage forming member having a liquid recovery outlet in a lower surface thereof, an upper surface of the substrate facing the lower surface of the flow-passage forming member during an exposure, and the liquid supplied from the supply inlet covering only a portion of the upper surface of the substrate during the exposure;
   a temperature sensor provided at the flow-passage forming member;
   a substrate stage having a substrate-holding member by which the substrate is held, the substrate-holding member holding the substrate on an underside of the substrate and the substrate-holding member being movable below the supply inlet; and
   a temperature adjustment system which performs temperature adjustment for the substrate-holding member depending on a temperature of the liquid to be supplied from the supply inlet onto the substrate held by the substrate-holding member.

2. The exposure apparatus according to claim 1, wherein the temperature adjustment system performs the temperature adjustment for the substrate-holding member so that heat transfer is reduced between the substrate and the liquid on the substrate.

3. The exposure apparatus according to claim 1, wherein the temperature adjustment system performs the temperature adjustment for the substrate-holding member so that no temperature change of the liquid is caused by contact between the liquid and the substrate.

4. The exposure apparatus according to claim 3, wherein the temperature adjustment system performs the temperature adjustment for the substrate-holding member so that no temperature distribution is generated in the liquid.

5. The exposure apparatus according to claim 3, further comprising a surface position-detecting unit which detects surface position information about a surface of the substrate by emitting a detecting light beam onto the substrate through the liquid and receiving a reflected light beam from the substrate through the liquid, wherein the temperature adjustment system performs the temperature adjustment for the substrate-holding member to suppress measurement error of the surface position-detecting unit due to the temperature change of the liquid.

6. The exposure apparatus according to claim 1, wherein the temperature adjustment system performs the temperature adjustment for the substrate-holding member so that no temperature change of the substrate is caused by contact between the liquid and the substrate.

7. The exposure apparatus according to claim 6, further comprising a mark-detecting system which detects an alignment mark on the substrate not through the liquid, wherein the temperature adjustment system performs the temperature adjustment for the substrate-holding member so that no temperature change of the substrate is caused by the contact between the liquid and the substrate after detecting the mark by the mark-detecting system.

8. The exposure apparatus according to claim 1, wherein the temperature adjustment system uses a liquid which is the same as the liquid to be supplied onto the substrate to perform the temperature adjustment for the substrate-holding member.

9. The exposure apparatus according to claim 1, further comprising a temperature sensor which measures a temperature of the substrate-holding member.

10. The exposure apparatus according to claim 9, wherein the temperature adjustment system performs the temperature adjustment for the substrate-holding member so that the measured temperature of the substrate-holding member is the same as the temperature of the liquid to be supplied onto the substrate held by the substrate-holding member.

11. A method for producing a device, comprising:
exposing a substrate using the exposure apparatus as defined in claim 1; and
processing the exposed substrate.

12. The exposure apparatus according to claim 1, wherein the temperature adjustment system performs the temperature adjustment for the substrate-holding member so that the temperature of the substrate-holding member is the same as the temperature of the liquid to be supplied onto the substrate held by the substrate-holding member.

13. The exposure apparatus according to claim 1, wherein the temperature adjustment system performs the temperature adjustment for the substrate-holding member so that no deformation of the substrate is caused by contact between the liquid and the substrate.

14. An exposure apparatus which exposes a first or a second substrate by radiating an exposure light beam onto the first or second substrate through a liquid, the exposure apparatus comprising:
a flow-passage forming member having a supply inlet from which the liquid is supplied, the flow-passage forming member having a liquid recovery outlet in a lower surface thereof, an upper surface of the substrate facing the lower surface of the flow-passage forming member during exposure;
a temperature sensor provided at the flow-passage forming member;
a first substrate stage having a first substrate-holding member by which the first substrate is held, the first substrate-holding member holding the first substrate on an underside of the first substrate and the first substrate-holding member being movable below the supply inlet;
a second substrate stage having a second substrate-holding member by which the second substrate is held, the second substrate-holding member holding the second substrate on an underside of the second substrate and the second substrate-holding member being movable below the supply inlet;
a measuring station which performs measurement for one of the substrates held by one of the stages;
an exposure station which performs exposure for the substrate held by the other of the stages, the exposure station being provided with the flow-passage forming member having the supply inlet from which the liquid is supplied onto the substrate held by the other of the stages, the supplied liquid covering only a portion of the upper surface of the substrate held by the other of the stages during the exposure; and
temperature adjustment systems which are provided for the first substrate stage and the second substrate stage respectively and which perform temperature adjustment for the substrate-holding member of each of the stages depending on a temperature of the liquid to be supplied from the supply inlet of the flow-passage forming member.

15. The exposure apparatus according to claim 14, wherein the measurement for the substrate in the measuring station includes measurement of surface position information about a surface of the substrate.

16. The exposure apparatus according to claim 14, wherein the measurement for the substrate in the measuring station includes detection of an alignment mark on the substrate.

17. The exposure apparatus according to claim 14, wherein the temperature adjustment system performs the temperature adjustment for the first substrate-holding member before performing the measurement for the first substrate and performs the temperature adjustment for the second substrate-holding member before performing the measurement for the second substrate.

18. The exposure apparatus according to claim 14, wherein the temperature adjustment system performs, after the measurement for the substrate in the measuring station, the temperature adjustment for the respective substrate-holding member to suppress temperature change of the substrate in the measuring station.

19. The exposure apparatus according to claim 14, further comprising a projection optical system which projects an image of a pattern through the liquid onto the substrate being exposed, wherein the exposure station is provided with the projection optical system.

20. A method for producing a device, comprising:
exposing a substrate using the exposure apparatus as defined in claim 14; and
processing the exposed substrate.

21. An exposure method comprising:
holding a substrate by a substrate-holding member on an underside of the substrate;
supplying a liquid from a supply inlet onto an upper surface of the substrate held by the substrate-holding member so that the supplied liquid covers only a portion of the upper surface of the substrate held by the substrate-holding member;
moving the substrate below the supply inlet;
exposing the substrate by radiating an exposure light beam onto the substrate through the liquid covering the portion of the upper surface of the substrate; and
measuring a temperature of the liquid supplied from the supply inlet; and
controlling a temperature of the substrate-holding member depending on the measured liquid temperature.

22. The exposure method according to claim 21, wherein the temperature of the substrate-holding member is controlled so that heat transfer between the substrate and the supplied liquid is prevented.

23. The exposure method according to claim 21, wherein the temperature of the substrate-holding member is controlled so that temperature change of the liquid on the substrate is prevented.

24. The exposure method according to claim 21, wherein the temperature of the substrate-holding member is controlled so that temperature change of the substrate due to contact between the supplied liquid and the substrate is prevented.

25. The exposure method according to claim 24, further comprising detecting an alignment mark on the substrate held by the substrate-holding member not through the liquid, wherein the temperature of the substrate-holding member is controlled so that the temperature change of the substrate caused after detecting the mark is prevented.

26. The exposure method according to claim 21, wherein the temperature of the substrate-holding member is controlled using a liquid which is the same as the liquid to be supplied onto the substrate.

27. The exposure method according to claim 26, wherein the temperature of the substrate-holding member is controlled by flowing the liquid in the substrate-holding member.

28. The exposure method according to claim 21, further comprising measuring the temperature of the substrate-holding member, wherein the temperature of the substrate-holding member is controlled so that the measured temperature of the substrate-holding member is the same as the temperature of the liquid to be supplied onto the substrate held by the substrate-holding member.

29. The exposure method according to claim 21, wherein the temperature of the substrate-holding member is controlled so that the temperature of the substrate-holding member is the same as the temperature of the liquid to be supplied onto the substrate held by the substrate-holding member.

30. The exposure method according to claim 21, wherein the temperature of the substrate-holding member is controlled so that deformation of the substrate due to contact between the supplied liquid and the substrate is prevented.

31. An exposure apparatus which exposes a substrate by radiating an exposure light beam onto the substrate through a liquid, the exposure apparatus comprising:
a flow-passing forming member having a supply inlet from which the liquid is supplied, the flow-passage forming member having a liquid recovery outlet in a lower surface thereof, an upper surface of the substrate facing the lower surface of the flow-passage forming member during an exposure, and the liquid supplied from the supply inlet covering only a portion of the upper surface of the substrate during the exposure;
a temperature sensor provided at the flow-passage forming member;
a substrate stage having a substrate-holding member by which the substrate is held, the substrate-holding member holding the substrate on an underside of the substrate and the substrate-holding member being movable below the supply inlet; and
a temperature adjustment system which performs temperature adjustment for the substrate-holding member so that a temperature of the substrate-holding member is the same as a temperature of the liquid to be supplied onto the substrate held by the substrate-holding member.

32. The exposure apparatus according to claim 31, wherein the temperature adjustment system performs the temperature adjustment for the substrate-holding member so that heat transfer is reduced between the substrate and the liquid on the substrate.

33. The exposure apparatus according to claim 31, wherein the temperature adjustment system performs the temperature adjustment for the substrate-holding member so that no temperature change of the liquid is caused by contact between the liquid and the substrate.

34. The exposure apparatus according to claim 33, wherein the temperature adjustment system performs the temperature adjustment for the substrate-holding member so that no temperature distribution is generated in the liquid.

35. The exposure apparatus according to claim 33, further comprising a surface position-detecting unit which detects surface position information about a surface of the substrate by emitting a detecting light beam onto the substrate through the liquid and receiving a reflected light beam from the substrate through the liquid, wherein the temperature adjustment system performs the temperature adjustment for the substrate-holding member to suppress measurement error of the surface position-detecting unit due to the temperature change of the liquid.

36. The exposure apparatus according to claim 31, wherein the temperature adjustment system performs the temperature adjustment for the substrate-holding member so that no temperature change of the substrate is caused by contact between the liquid and the substrate.

37. The exposure apparatus according to claim 36, further comprising a mark-detecting system which detects an alignment mark on the substrate not through the liquid, wherein the temperature adjustment system performs the temperature adjustment for the substrate-holding member so that no temperature change of the substrate is caused by the contact between the liquid and the substrate after detecting the mark by the mark-detecting system.

38. The exposure apparatus according to claim 31, wherein the temperature adjustment system uses a liquid which is the same as the liquid to be supplied onto the substrate to perform the temperature adjustment for the substrate-holding member.

39. The exposure apparatus according to claim 31, further comprising a temperature sensor which measures a temperature of the substrate-holding member.

40. The exposure apparatus according to claim 39, wherein the temperature adjustment system performs the temperature adjustment for the substrate-holding member so that the measured temperature of the substrate-holding member is the same as the temperature of the liquid to be supplied onto the substrate held by the substrate-holding member.

* * * * *